US009780200B2

(12) United States Patent
Zhu

(10) Patent No.: US 9,780,200 B2
(45) Date of Patent: Oct. 3, 2017

(54) SEMICONDUCTOR ARRANGEMENT FOR A FINFET AND METHOD FOR MANUFACTURING THE SAME

(71) Applicant: INSTITUTE OF MICROELECTRONICS, CHINESE ACADEMY OF SCIENCES, Beijing (CN)

(72) Inventor: Huilong Zhu, Poughkeepsie, NY (US)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 1 day.

(21) Appl. No.: 14/411,073

(22) PCT Filed: Jan. 16, 2014

(86) PCT No.: PCT/CN2014/070713
§ 371 (c)(1),
(2) Date: Dec. 23, 2014

(87) PCT Pub. No.: WO2015/078104
PCT Pub. Date: Jun. 4, 2015

(65) Prior Publication Data
US 2016/0268392 A1    Sep. 15, 2016

(30) Foreign Application Priority Data
Nov. 28, 2013    (CN) .......................... 2013 1 0627406

(51) Int. Cl.
H01L 29/66    (2006.01)
H01L 21/62    (2006.01)
(Continued)

(52) U.S. Cl.
CPC .... *H01L 29/6681* (2013.01); *H01L 21/76224* (2013.01); *H01L 29/6653* (2013.01);
(Continued)

(58) Field of Classification Search
CPC ............. H01L 29/66795; H01L 29/785; H01L 29/4238; H01L 29/0696; H01L 27/0207
See application file for complete search history.

(56) References Cited

U.S. PATENT DOCUMENTS 8,581,320 B1 * 11/2013 Cheng .................... H01L 21/84
257/309
2006/0046355 A1 * 3/2006 Parekh ............. H01L 21/76801
438/149
(Continued)

FOREIGN PATENT DOCUMENTS

| CN | 102468161 A | 5/2012 |
| CN | 103137624 A | 6/2013 |
| CN | 103219340 A | 7/2013 |

*Primary Examiner* — Marcos D Pizarro
*Assistant Examiner* — Long H Le
(74) *Attorney, Agent, or Firm* — Christensen, Fonder, Dardi & Herbert PLLC

(57) ABSTRACT

A semiconductor arrangement and a method for manufacturing the same. An arrangement may include a bulk semiconductor substrate; a fin formed on the substrate; a first FinFET and a second FinFET formed on the substrate. The first FinFET comprises a first gate stack intersecting the fin and a first gate spacer disposed on sidewalls of the first gate stack. The second FinFET includes a second gate stack intersecting the fin and a second gate spacer disposed on sidewalls of the second gate stack; a dummy gate spacer formed between the first FinFET and the second FinFET and intersecting the fin; an isolation section self-aligned to a space defined by the dummy gate spacer. The isolation
(Continued)

section electrically isolates the first FinFET from the second FinFET; and an insulation layer disposed under and abutting the isolation section.

8 Claims, 25 Drawing Sheets

(51) Int. Cl.
    *H01L 29/78*     (2006.01)
    *H01L 21/762*     (2006.01)

(52) U.S. Cl.
    CPC .. *H01L 29/66545* (2013.01); *H01L 29/66795* (2013.01); *H01L 29/785* (2013.01); *H01L 29/7848* (2013.01)

(56) References Cited

U.S. PATENT DOCUMENTS

| | | | |
|---|---|---|---|
| 2008/0237634 A1 | 10/2008 | Dyer et al. | |
| 2013/0140639 A1 | 6/2013 | Shieh et al. | |
| 2013/0187237 A1 | 7/2013 | Yu et al. | |
| 2013/0285141 A1* | 10/2013 | Kuo | H01L 29/66545 257/347 |
| 2015/0021710 A1* | 1/2015 | Hsu | H01L 27/0886 257/401 |
| 2015/0357468 A1* | 12/2015 | Zhu | H01L 29/66545 257/192 |

* cited by examiner

SEMICONDUCTOR ARRANGEMENT FOR A FINFET AND METHOD FOR MANUFACTURING THE SAME

CROSS-REFERENCE TO RELATED APPLICATION(S)

This application is a U.S. national phase application of PCT Application No. PCT/CN2014/070713, filed on Jan. 16, 2014, entitled "SEMICONDUCTOR ARRANGEMENT AND METHOD FOR MANUFACTURING THE SAME," which claims priority to Chinese Application No. 201310627406.8, filed on Nov. 28, 2013. Both the PCT Application and the Chinese Application are incorporated herein by reference in their entirety.

FIELD OF THE INVENTION

The present disclosure generally relates to manufacture of integrated circuits, and in particular, to a semiconductor arrangement comprising an isolation section with a reduced area penalty and a method for manufacturing the same.

BACKGROUND

With increasing demands for multi-functional miniaturized electronic devices, it is expected to integrate more and more devices on a wafer. However, current devices have already been so miniaturized to approach physical limits, and thus it is more and more difficult to further reduce an average area per device. Further, any area penalty may result in increased cost.

One of solutions to follow the trend of miniaturization is 3D devices, such as, FinFETs (Fin Field Effect Transistors). The FinFETs have reduced footprints on a wafer surface by extending in a height direction. However, as compared with planar devices such as MOSFETs, more areas are occupied by isolation between FinFETs because each isolation requires two dummy gates.

SUMMARY

In view of the above, the present disclosure proposes a semiconductor arrangement and a method for manufacturing the same to address at least the above problems and/or at least provide the following advantages.

According to an aspect of the present disclosure, a semiconductor arrangement is provided. The semiconductor arrangement comprises: a bulk semiconductor substrate; a fin formed on the substrate; a first FinFET and a second FinFET formed on the substrate, wherein the first FinFET comprises a first gate stack intersecting the fin and a first gate spacer disposed on sidewalls of the first gate stack, the second FinFET comprises a second gate stack intersecting the fin and a second gate spacer disposed on sidewalls of the second gate stack; a dummy gate spacer formed between the first FinFET and the second FinFET and intersecting the fin; an isolation section self-aligned to a space defined by the dummy gate spacer, wherein the isolation section electrically isolates the first FinFET from the second FinFET; and an insulation layer disposed under and abutting the isolation section.

According to another aspect of the present disclosure, a method for manufacturing a semiconductor arrangement is provided. The method comprises: forming a fin on a bulk semiconductor substrate; forming an insulation layer in a region of the substrate such that the insulation layer passes under the fin and abuts the fin; forming a dummy gate structure intersecting the fin in the region on the bulk semiconductor substrate, and also a first gate structure and a second gate structure intersecting the fin on opposite sides of the dummy gate structure; forming a first gate spacer, a second gate spacer, and a dummy gate spacer on sidewalls of the first gate structure, the second gate structure, and the dummy gate structure, respectively; forming a trench self-aligned to a space defined by the dummy gate spacer, wherein the trench extends to the insulation layer; and filling the trench with a dielectric material to form an isolation section.

According to embodiments of the present disclosure, it is possible to form an isolation section, such as STI, self-aligned to the space defined by the dummy gate spacer. As a result, each isolation needs only one dummy gate, and thus the footprint of the isolation section can be reduced. The technology of the present disclosure is especially applicable to FinFETs.

BRIEF DESCRIPTION OF THE DRAWINGS

The above and other objects, features, and advantages of the present disclosure will become apparent from following descriptions of embodiments with reference to the attached drawings, in which.

DETAILED DESCRIPTION

Figure 1A:
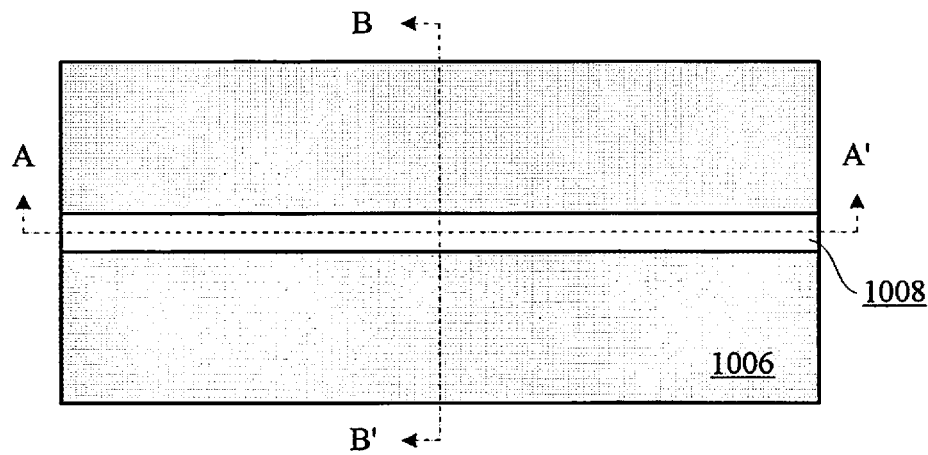
FIGS. 1-21 are schematic views illustrating some steps of a process for manufacturing a semiconductor arrangement in accordance with an embodiment of the present disclosure.

Hereinafter, descriptions are given with reference to embodiments shown in the attached drawings. However, it is to be understood that these descriptions are illustrative and not intended to limit the present disclosure. Further, in the following, known structures and technologies are not described to avoid obscuring the present disclosure unnecessarily.

In the drawings, various structures according to the embodiments are schematically shown. However, they are not drawn to scale, and some features may be enlarged while some features may be omitted for sake of clarity. Moreover, shapes and relative sizes and positions of regions and layers shown in the drawings are also illustrative, and deviations may occur due to manufacturing tolerances and technique limitations in practice. Those skilled in the art can also devise regions/layers of other different shapes, sizes, and relative positions as desired.

In the context of the present disclosure, when a layer/element is recited as being "on" a further layer/element, the layer/element can be disposed directly on the further layer/element, or otherwise there may be an intervening layer/element interposed therebetween. Further, if a layer/element is "on" a further layer/element in an orientation, then the layer/element can be "under" the further layer/element when the orientation is turned.

According to an embodiment of the present disclosure, a semiconductor arrangement is provided. The semiconductor arrangement is manufactured, for example, on a bulk semiconductor substrate. The semiconductor arrangement may comprise a first semiconductor device and a second semiconductor device disposed adjacent to each other on the substrate. Such semiconductor devices may comprise Fin-FETs, for example. In this case, each of the semiconductor devices may comprise a fin and a gate stack intersecting the fin. For example, the fin may be achieved by patterning the substrate. In some examples, the first semiconductor device and the second semiconductor device may share a common fin. Further, on sidewalls of the gate stack, a gate spacer may be formed.

In order to electrically isolate the first semiconductor device from the second semiconductor device (if required), an isolation section, such as Shallow Trench Isolation (STI), may be formed therebetween. Such an isolation section may be self-aligned to a space defined by a dummy gate spacer (in its inner side) disposed between the first semiconductor device and the second semiconductor device. Such a self-aligned isolation section may be formed by performing etching with the dummy gate spacer as a mask to form a trench (thus having sidewalls extending substantially along inner walls of the dummy gate spacer), and then filling a dielectric material into the trench.

For example, the dummy gate spacer may be manufactured according to the same processes as those for the respective gate spacers of the first semiconductor device and the second semiconductor device. Further, a dummy gate stack may be formed according to the same processes as those for the respective gate stacks of the first semiconductor device and the second semiconductor device. In other words, a dummy device (comprising the dummy gate stack and the dummy gate spacer) similar to the first and/or second semiconductor devices may be formed between the first semiconductor device and the second semiconductor device. These devices (including the dummy device) may have substantially the same gate stacks and gate spacers, and their gate stacks and thus gate spacers may be substantially aligned with each other.

In a case where the first semiconductor device and the second semiconductor device share a common fin, the dummy gate structure may intersect the fin to form a dummy FinFET. That is, three devices (including one dummy device) that intersect the common fin may be formed. In this case, a dummy gate isolation section (or a trench) may extend to pass through the fin, such that respective active regions of the first semiconductor device and the second semiconductor device may be isolated from each other.

Source/drain regions of the respective semiconductor devices may be formed on opposite sides of the respective gate stacks in the substrate (in a case of FinFET, formed in the fin, for example). In an example, a further semiconductor layer which is at least partially embedded into the fin may be formed, and the source/drain regions may be formed at least partially in the further semiconductor layer. The further semiconductor layer may comprise a material different from that of the substrate, to apply stress to a channel region. For example, for an N-type device, tensile stress may be applied; and for a P-type device, compressive stress may be applied.

In an example, the semiconductor arrangement may further comprise an insulation layer formed under the isolation section and abutting the isolation section. The insulation layer may extend substantially along the space defined by the dummy gate spacer (or along the isolation section), and may extend beyond this space (or the isolation section) in a lateral direction. The substrate may comprise a doped well, and the insulation layer may be disposed in an upper portion of the doped well and defined between the first semiconductor device and the second semiconductor device. In a case of FinFET, a sidewall of the insulation layer facing the first FinFET may be closer to the first FinFET than a sidewall of the isolation section facing the first FinFET, and a sidewall of the insulation layer facing the second FinFET may be closer to the second FinFET than a sidewall of the isolation section facing the second FinFET. Further, this insulation layer may pass under the fin, for example, extending between the fin and the substrate.

Further, the semiconductor arrangement may further comprise a further insulation layer under the fin(s) of the first semiconductor device and/or the second semiconductor device. This insulation layer may be similar to the above insulation layer. Specifically, it may extend substantially along the corresponding gate structure, may extend laterally beyond the corresponding gate structure, and may pass under the fin. In this way, advantages similar to those of an SOI structure, such as, a reduced leakage current, may be achieved. Further, the insulation layer may extend not to be under the source/drain regions or may extend at most to be partially under the source/drain regions, such that disadvantages of an SOI structure, such as self-heating, can be avoided.

Such a semiconductor arrangement can be manufactured as follows. For example, a first gate structure and a second gate structure, and also a dummy gate structure disposed therebetween may be formed on a substrate. Then, gate spacers may be formed on sidewalls of the respective gate structures. These processes for the gate structures and the dummy gate structure may be performed in the same way. In other words, these processes may be performed as if three gate structures were formed. For example, a gate dielectric layer and a gate conductor layer may be formed on the substrate, and then may be patterned into three gate structures. A mask layer may be further formed on the gate conductor layer to protect the gate structures in subsequent processes. After that, the gate structures and the gate spacers may be used to manufacture devices (for example, forming of source/drain regions). The processes for manufacturing the devices may also be performed on the dummy gate structure (resulting in a dummy device).

These semiconductor devices (including the dummy device) may be FinFETs. In this case, before the gate structures are formed, a fin may be formed on the substrate. For example, the fin may be formed by patterning the substrate (and/or a semiconductor layer formed on the substrate). In an example, the first and second semiconductor devices and the dummy device may share a common fin. That is, their respective gate structures may intersect the same fin. An insulation layer may be formed in a region on the substrate in which the dummy gate structure is to be formed. The insulation layer may pass under the fin and abut the fin. Further insulation layers may be formed in regions on the substrate in which the first and second gate structures are to be formed respectively. The further insulation layers may pass under the fin and abut the fin. For example, such an insulation layer may be achieved by removing a portion of the substrate under the fin and filling a space due to removal of this portion of substrate with a dielectric material.

After manufacturing the devices (for example, the forming of the source/drain regions), a trench self-aligned to a space defined by the dummy gate spacer may be formed. This trench may extend to the insulation layer. For example, in a case of FinFET, it may pass through the fin. An isolation section may be formed by filling the trench with a dielectric material.

Such a trench may be formed, for example, as follows. A mask layer may be formed to mask the region for the first semiconductor device and the region for the second semiconductor device, and to expose at least the space defined by the dummy gate spacer (which is occupied by the dummy gate structure at this time). For example, the mask layer may extend onto the dummy gate spacer, but expose the dummy gate structure. After that, the dummy gate structure may be selectively etched with respect to the dummy gate spacer, and the fin may be further selectively etched, to form the trench. The mask layer may comprise a stack of oxide and nitride, and the first gate spacer, the second gate spacer, and the dummy gate spacer may comprise nitride.

According to an embodiment of the present disclosure, a gate-last process may be used in manufacturing the devices. In this case, the gate dielectric layer and the gate conductor layer as described above may be a sacrificial dielectric layer and a sacrificial conductor layer. After the source/drain regions are formed, the sacrificial gate structures inside the respective gate spacers may be removed, and spaces defined by the respective gate spacers may filled with replacement gate stacks (each comprising a replacement gate dielectric layer and a replacement gate conductor layer). In this case, the replacement gate dielectric layer may extend on inner walls of the respective gate spacers. In etching the trench, a portion of the replacement gate dielectric layer which is located on the inner walls of the dummy gate spacer may be reserved.

According to an embodiment of the present disclosure, in order to further improve device performances, the epitaxial source/drain technology may be used. For example, a further semiconductor layer which is at least partially embedded into the fin may be formed on respective opposite sides of the first gate spacer and/or the second gate spacer. Such a further semiconductor layer may be formed, for example, as follows. In particular, the fin may be selectively etched with the respective gate structures and gate spacers as a mask, such that a trench may be formed therein, and the further semiconductor layer may be grown epitaxially in the trench. During the epitaxial growth, in-situ doping may be performed.

The present disclosure can be presented in various ways, some of which will be illustrated in the following.

FIGS. 1-21 are schematic views illustrating some steps of a process for manufacturing a semiconductor arrangement in accordance with an embodiment of the present disclosure.

Figure 1B:
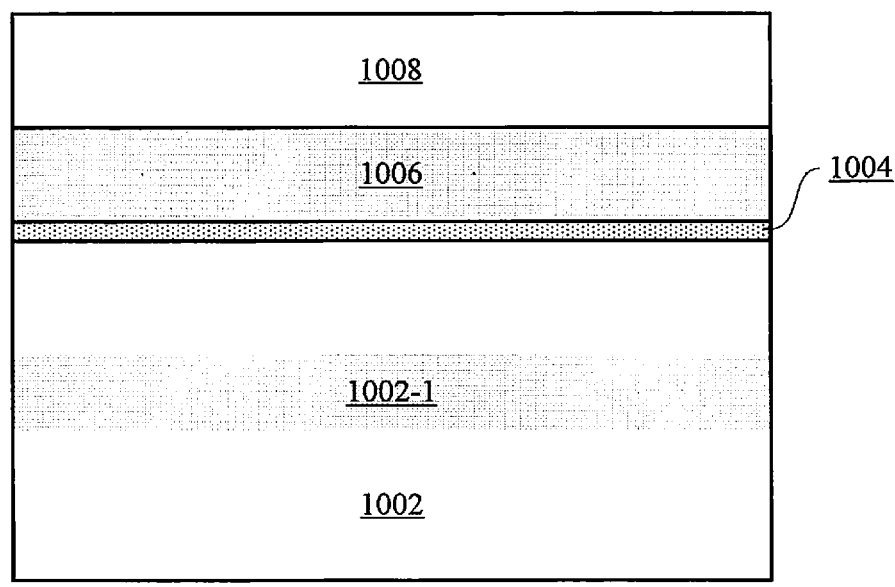
Figure 1C:
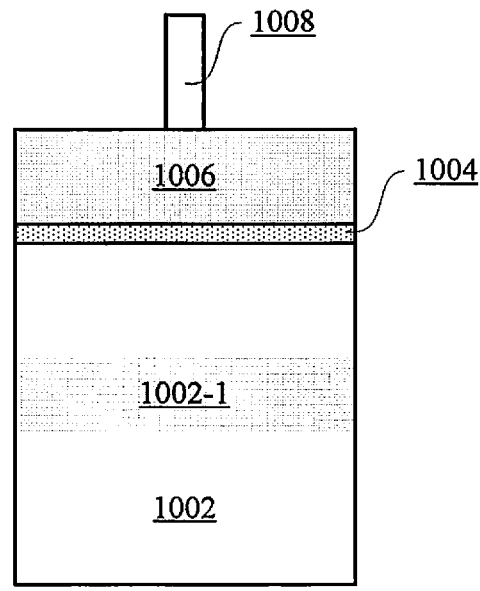

As shown in FIG. 1 (FIG. 1(a) is a top view, FIG. 1(b) is a cross-sectional view taken along line AA' in FIG. 1(a), and FIG. 1(c) is a cross-sectional view taken along line BB' in FIG. 1(a)), a bulk substrate 1002 is provided. The substrate may comprise any suitable bulk semiconductor material, such as, Si, Ge, and/or SiGe, etc. Hereinafter, silicon system materials are described by way of example, but the present disclosure is not limited thereto.

In the substrate 1002, a well region 1002-1 may be formed by, for example, ion implantation. For example, for a P-type device, an N-type well region may be formed; and for an N-type device, a P-type well region may be formed. For example, the N-type well region may be formed by implanting N-type dopants, such as P or As, into the substrate 1002, and the P-type well region may be formed by implanting P-type dopants, such as B, into the substrate 1002. If needed, annealing may be performed after the implantation. One skilled in the art may contemplate various ways to form an N-type well and/or a P-type well, and thus detailed descriptions thereof are omitted for simplicity.

On the substrate 1002, a mask layer may be formed by, for example, deposition. The mask layer may comprise a stack of an oxide layer 1004 (such as, silicon nitride) with a thickness of about 5-20 nm and a nitride layer 1006 (such as, silicon nitride) with a thickness of about 50-150 nm. On the mask layer, photoresist 1008 may be formed. The photoresist 1008 may be patterned into a fin-like shape by, for example, photolithography, to facilitate forming a fin on the substrate subsequently.

Figure 2A:
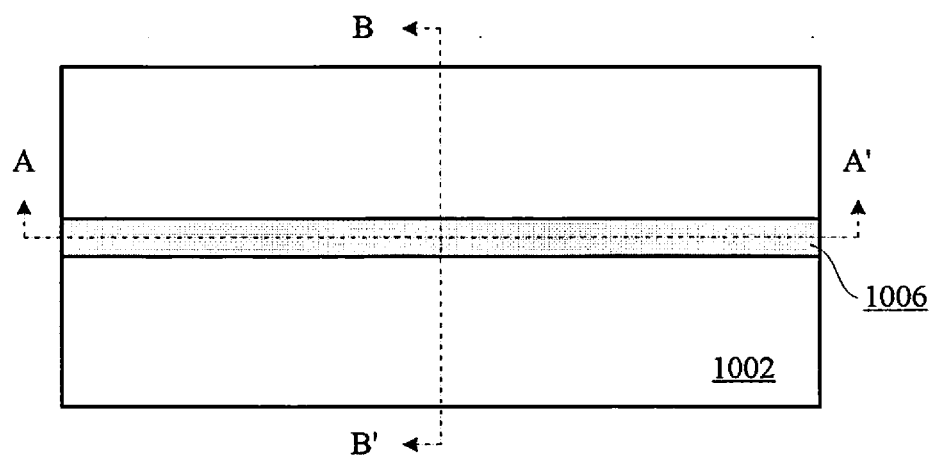
Figure 2B:
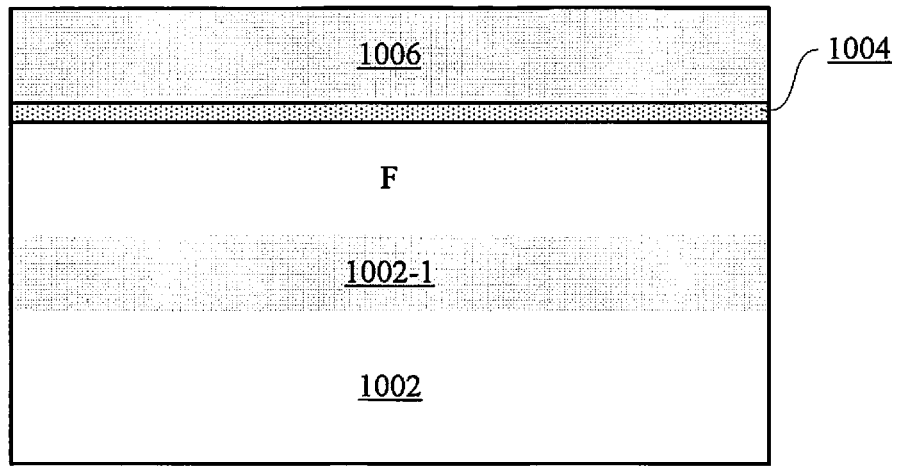
Figure 2C:
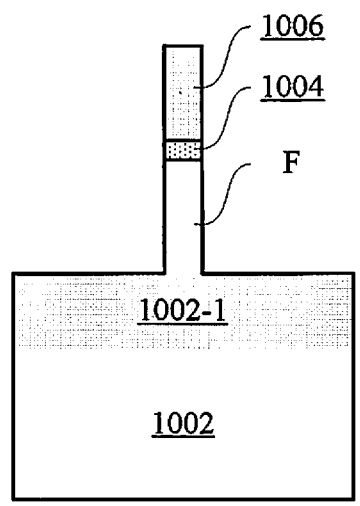

Next, as shown in FIG. 2 (FIG. 2(a) is a top view, FIG. 2(b) is a cross sectional view taken along line AA' in FIG. 2(a), and FIG. 2(c) is a cross sectional view taken along line BB' in FIG. 2(a)), the mask layer and the substrate 1002 may be selectively etched in turn by, for example, Reactive Ion Etching (RIE), with the photoresist 1008 as a mask, thereby forming a fin F. After that, the photoresist 1008 may be removed.

In this example, the fin is formed by directly patterning the substrate. However, the present disclosure is not limited thereto. For example, an epitaxial layer may be formed on the substrate, and the fin may be formed by patterning the epitaxial layer. In the present disclosure, the expression "forming a fin on a substrate" means forming a fin a substrate in any appropriate manner, and the expression "a fin formed on a substrate layer" means any fin which is formed on a substrate in any appropriate manner.

Further, in the example shown in FIG. 2, in forming the fin F, the selective etching is stopped at a top surface of the well 1002-1. However, the present disclosure is not limited thereto. For example, the selective etching may enter into the well 1002-1.

In an example, in order to reduce punch-through, an insulation layer which passes under the fin may be formed in a region where an isolation section is to be formed.

Figure 3A:
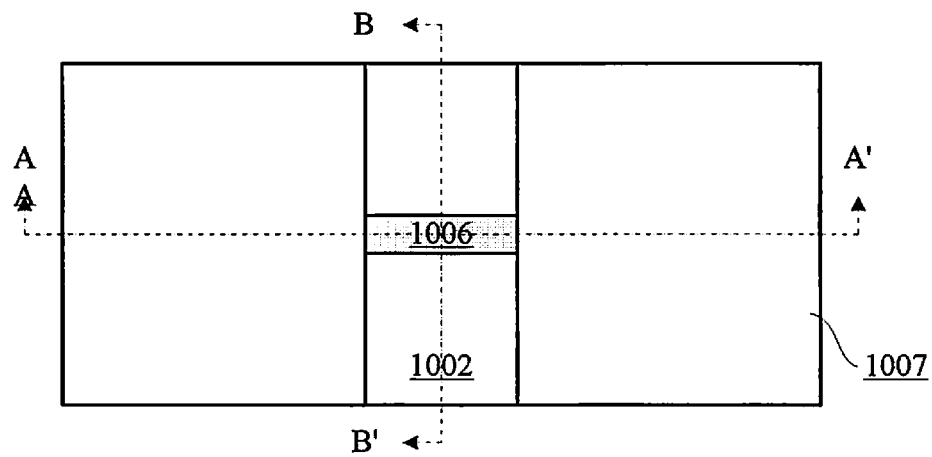
Figure 3B:
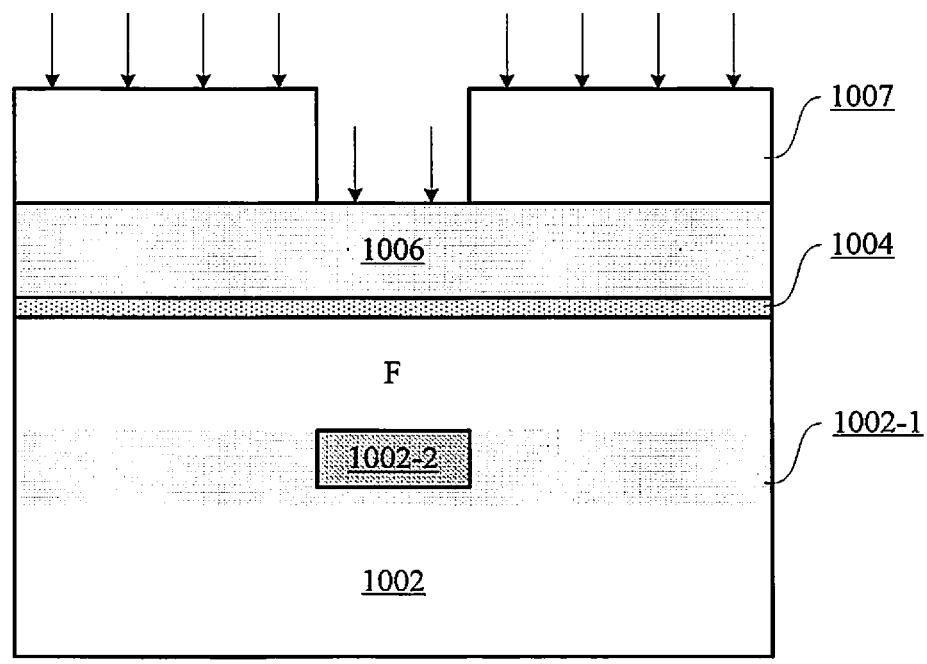
Figure 3C:
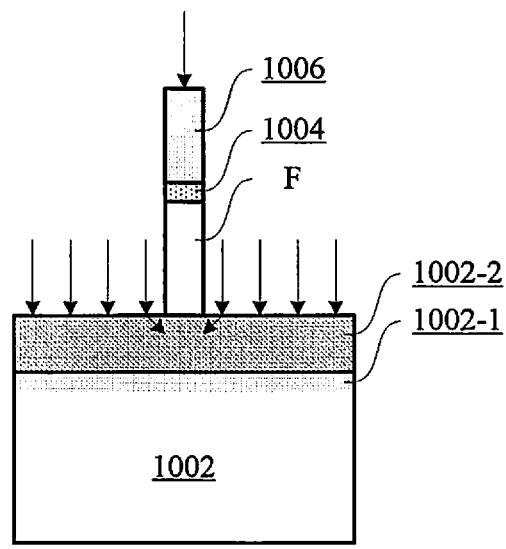
Figure 4A:
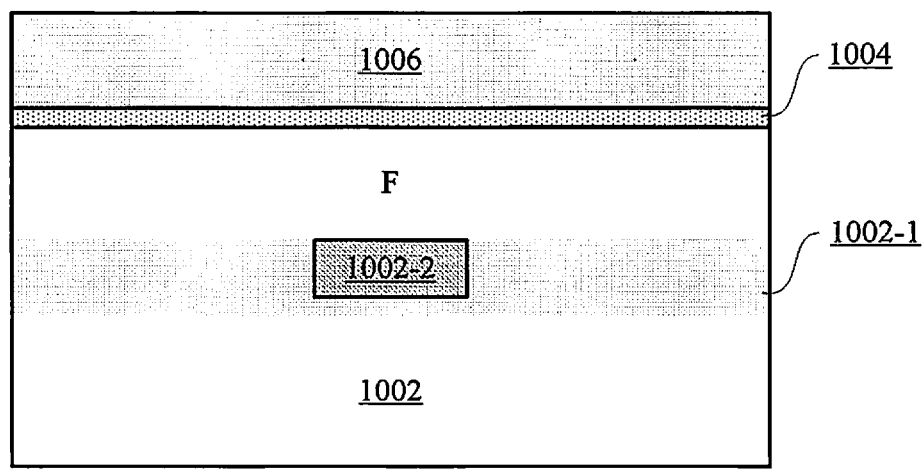
Figure 4B:
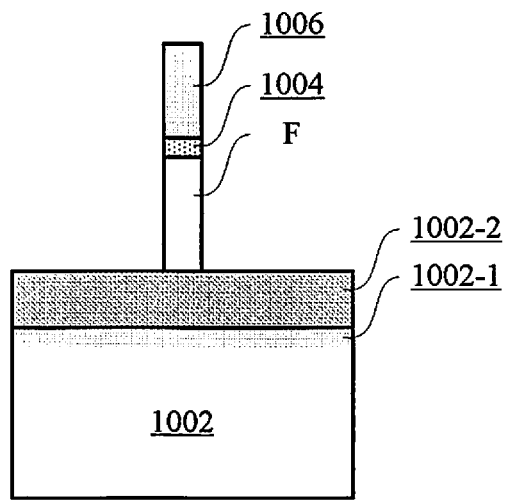

In particular, as shown in FIG. 3 (FIG. 3(a) is a top view, FIG. 3(b) is a cross sectional view taken along line AA' in FIG. 3(a), and FIG. 3(c) is a cross sectional view taken along line BB' in FIG. 3(a)), a mask layer 1007 (for example, photoresist) may be used to mask regions in which actual devices are to be formed subsequently, and to expose the region in which the isolation section is to be formed subsequently. After that, implantation may be performed as shown by arrows in the figure, such that a portion of the substrate 1002 is modified to form a modified portion 1002-2. For example, Ge may be implanted at a dose greater than 2E14 $cm^{-2}$, and thereby the crystalline silicon in the substrate 1002 may be modified to amorphous silicon. A portion of the substrate 1002 which is exposed by the mask layer 1007 and the fin F (on which the mask layer 1004 and 1006 are formed) directly undergoes the implantation, and thus is modified. An implantation depth may be controlled to control a thickness of the modified portion 1002-2. As shown in FIGS. 3(b) and 3(c), under the fin F, due to atom scattering, a further portion of the substrate 1002 which is under the fin F is also modified, though it does not directly undergo the implantation. Because of the presence of the mask layer (1004, 1006), the fin F is substantially not affected by the implantation. After that, the mask layer 1007 may be removed, resulting in a structure as shown in FIG. 4 (FIG. 4(a) corresponds to the cross sectional view of FIG. 3(b), and FIG. 4(b) corresponds to the cross sectional view of FIG. 3(c)).

Figure 5A:
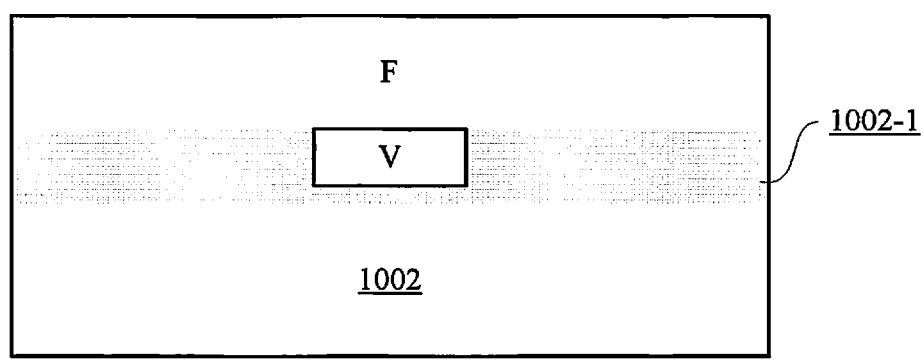
Figure 5B:
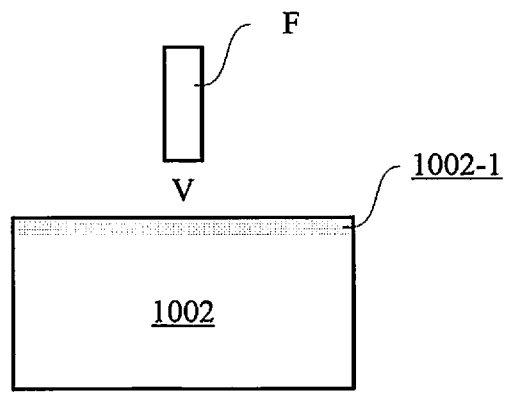

After that, as shown in FIG. 5, the mask layer 1006 and 1004 may be removed by, for example, RIE. The amorphous silicon may be selectively etched with respect to the crystalline silicon by, for example, RIE, to remove the modified portion 1002-2. In this way, a gap V is formed under the fin F. Subsequently, as shown in FIG. 6, the gap V may be filled (by, for example, deposition and etching-back) with a dielectric material, such as oxide, to form an insulation layer 1003.

The insulation layer presents, in a top view, a shape defined by the mask layer 1007 (referring to FIG. 3(*a*)) (in this example, a vertically extending strip), and the insulation layer passes under the fin F.

Figure 6A:
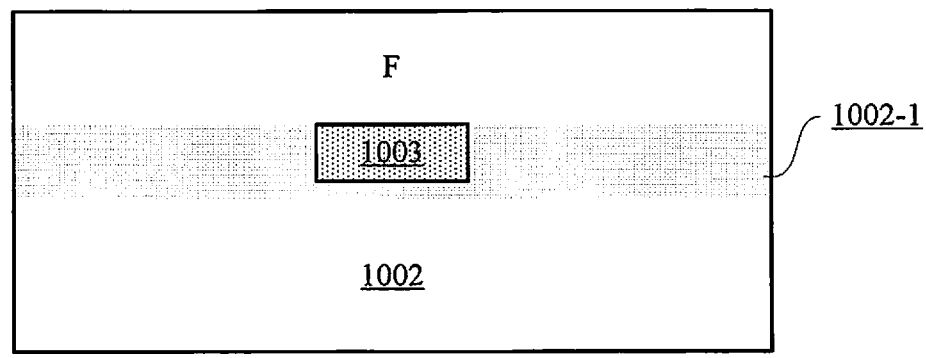
Figure 6B:
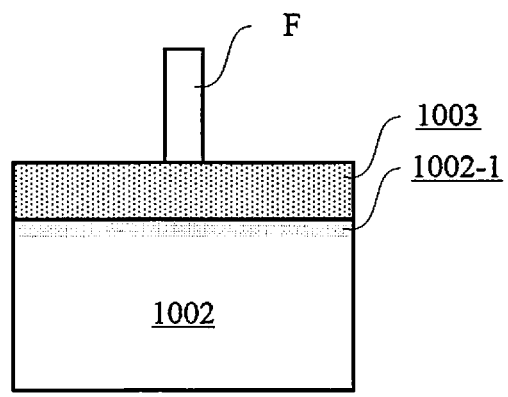

In the example shown in FIG. 6, a top surface of the insulation layer 1003 is shown to be flush with a bottom surface of the fin F. However, the present disclosure is not limited thereto. For example, based on the amount of etching-back, the top surface of the insulation layer 1003 may be (slightly) higher or (slightly) lower than the bottom surface of the fin F.

It is to be noted that the way to form the insulation layer is not limited to that described above. For example, a sacrificial layer and a fin body layer may be formed on the substrate by, for example, epitaxial growth, and then patterned into a fin. After that, a mask like the mask layer 1007 may be disposed, and then the sacrificial layer may be selectively removed by, for example, RIE, to form a gap under the fin body layer. By filling the gap with a dielectric material, a similar insulation layer may be formed.

After forming the fin and preferably the insulation layer as described above, processes for manufacturing devices, such as forming gate stacks, forming source/drain, or the like, may be performed.

Figure 7A:
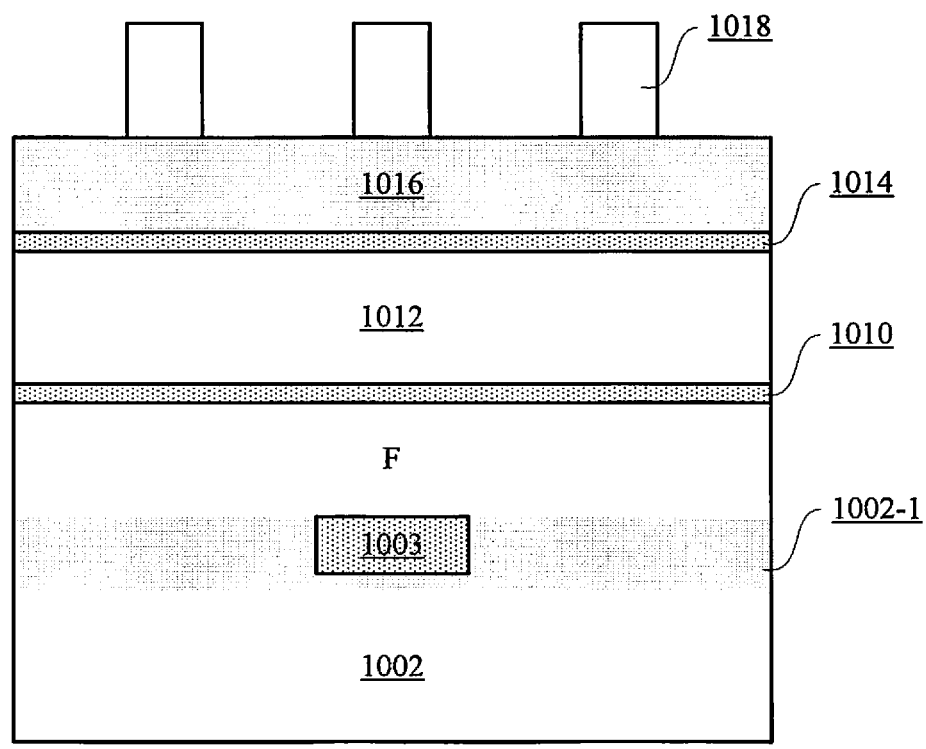
Figure 7B:
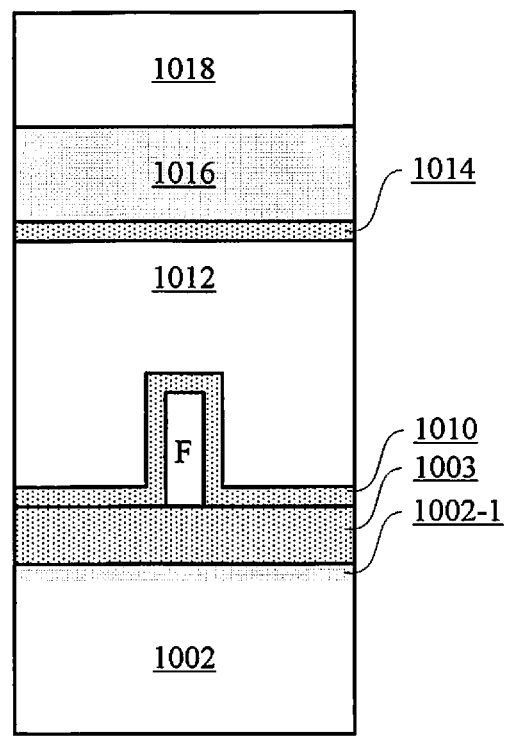

In particular, as shown in FIG. 7, a sacrificial gate dielectric layer 1010 and a sacrificial gate conductor layer 1012 may be formed in turn on the substrate by, for example, deposition. For example, the sacrificial gate dielectric layer 1010 comprises oxide with a thickness of about 1-5 nm, and the sacrificial gate conductor layer 1012 comprises crystalline silicon or amorphous silicon with a thickness of about 50-150 nm. If needed, the deposited sacrificial gate conductor layer 1012 may be planarized by, for example, Chemical Mechanical Polishing (CMP). After that, a mask layer may be formed on the sacrificial gate conductor layer 1012 by, for example, deposition. The mask layer may comprise a stack of an oxide layer 1014 with a thickness of about 3-5 nm and a nitride layer 1016 with a thickness of about 50-150 nm. On the mask layer, photoresist 1018 may be formed. The photoresist 1018 may be patterned by, for example, photolithography, into a shape corresponding to the gate stacks to be formed (referring to FIG. 8(*a*), in this example, patterned into three substantially parallel straight strips).

Figure 8A:
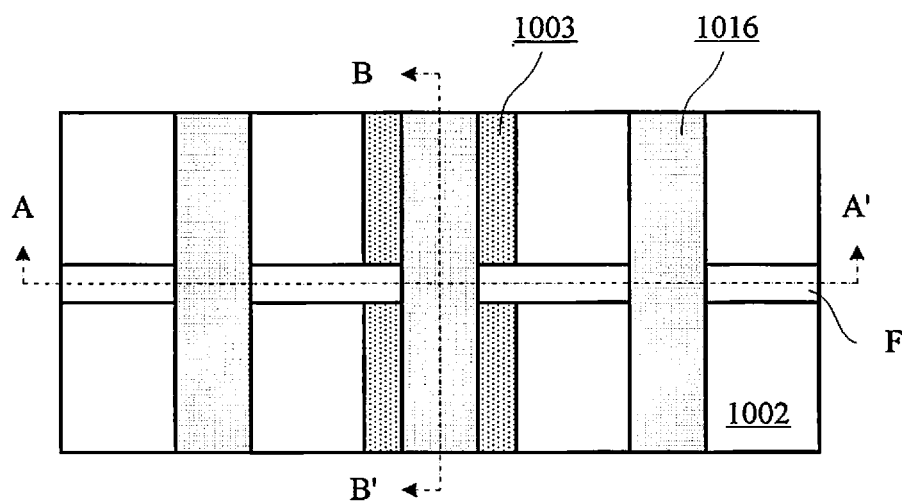
Figure 8B:
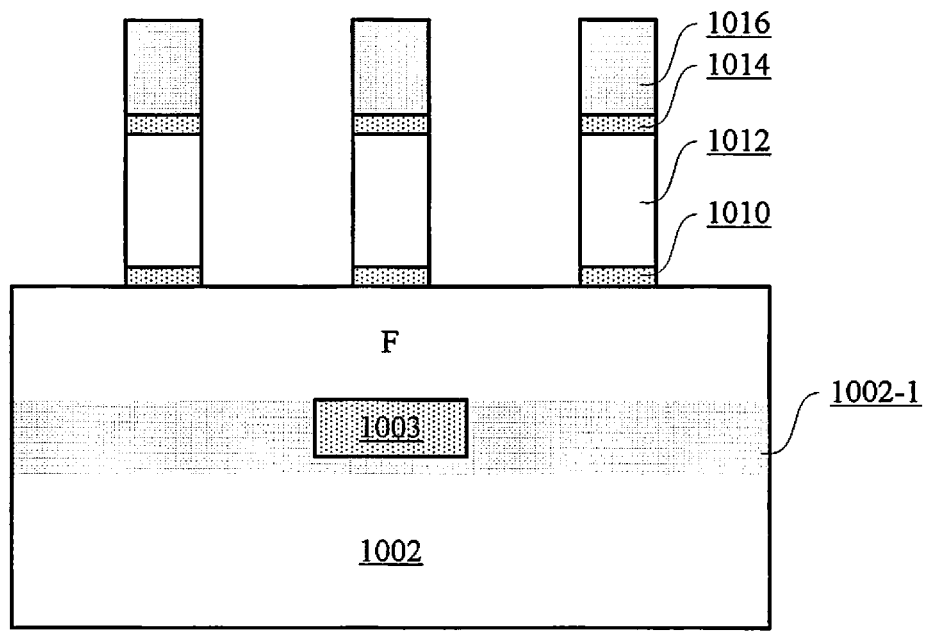
Figure 8C:
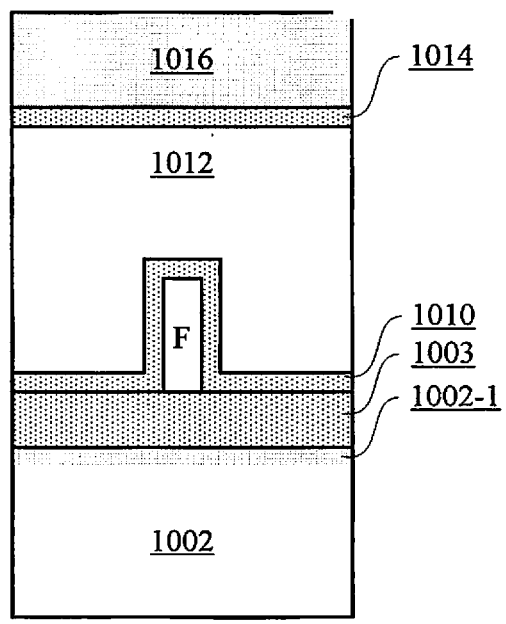

After that, as shown in FIG. 8 (FIG. 8(*a*) is a top view, FIG. 8(*b*) is a cross sectional view taken along line AA' in FIG. 8(*a*), and FIG. 8(*c*) is a cross sectional view taken along line BB' in FIG. 8(*a*)), the nitride layer 1016, the oxide layer 1014, the sacrificial gate conductor layer 1012, and the sacrificial gate dielectric layer 1010 may be selectively etched in turn by, for example, RIE, with the photoresist 1018 as a mask. Subsequently, the photoresist 1018 may be removed. In this way, three strip-like gate structures are formed. Here, the so-called "gate structure" refers to one or more layers in the (sacrificial) gate stack or the (sacrificial) gate stack itself. For example, in the example as shown in the figure, the gate structure may refer to the sacrificial gate conductor layer 1012 and the sacrificial gate dielectric layer 1010 after being patterned (that is, the sacrificial gate stack itself). The middle (dummy) gate structure may have a lateral size less than that of the previously formed insulation layer 1003. Such a difference in the lateral size is mainly used to guarantee the process margin, especially to guarantee that the dummy gate structure is well located on top of the insulation layer 1003.

Figure 9:
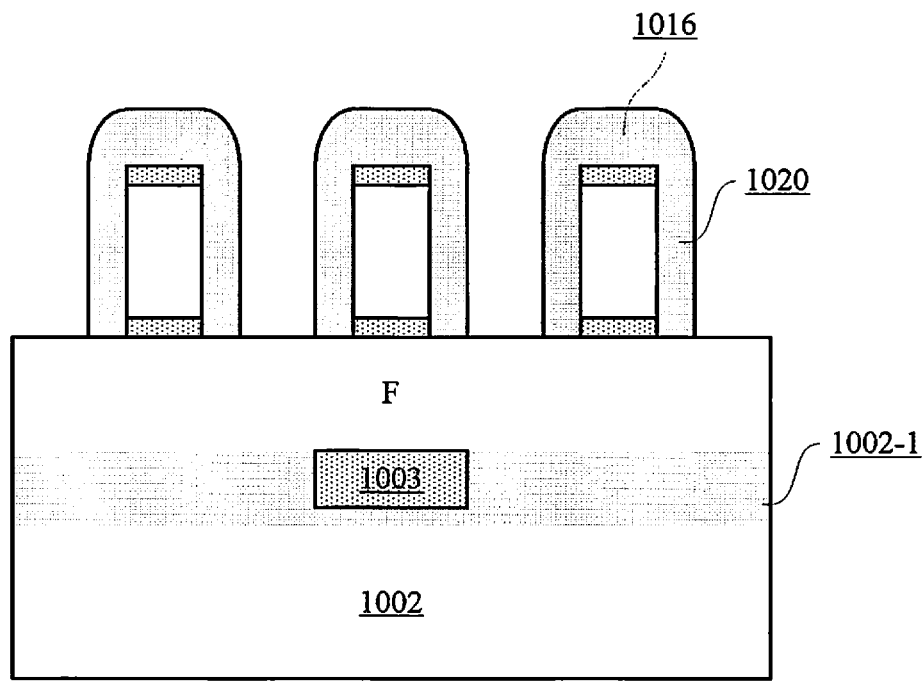

Subsequently, as shown in FIG. 9 (corresponding to the cross section shown in FIG. 8(*b*)), gate spacers 1020 may be formed on sidewalls of the respective gate structures. One skilled in the art knows various ways to form such spacers. For example, a layer of nitride may be deposited on the structure shown in FIG. 8 in a substantially conformal way, and then RIE may be performed on the layer of nitride in a substantially vertical direction to form the spacers 1020. The spacers 1020 each may have a width of about 5-30 nm. Here, the mask layer on top of the gate structures is not removed, mainly for the purpose of protecting the gate structures in subsequent processes. In this example, because both the nitride layer 1016 and the spacers 1020 comprise nitride, they are shown as a whole in the figures.

Figure 10:
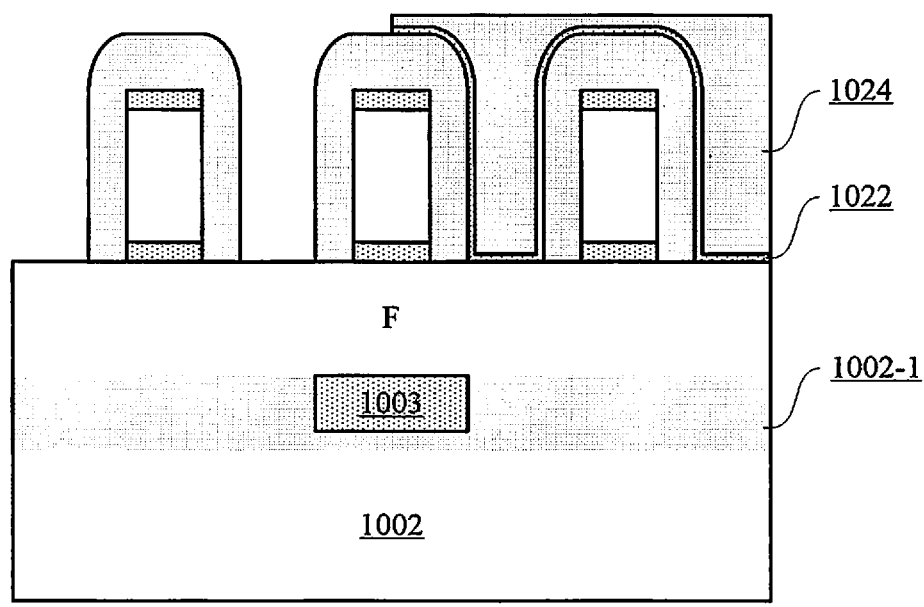

Here, a case where one P-type device and one N-type device are formed is described. In this case, as shown in FIG. 10, a region for the N-type device (the right region in the figure) may be masked by a mask layer. For example, the mask layer may comprise an oxide layer 1022 with a thickness of about 3-10 nm and a nitride layer 1024. This mask layer may extend onto a top surface of the middle gate structure, and expose a region for the P-type device (the left region in the figure).

Although a case where one P-type device and one N-type device, two devices in total, are formed is described here, the present disclosure is not limited thereto. The technology of the present disclosure is also applicable to form more or less semiconductor devices of the same type or different types.

Figure 11:
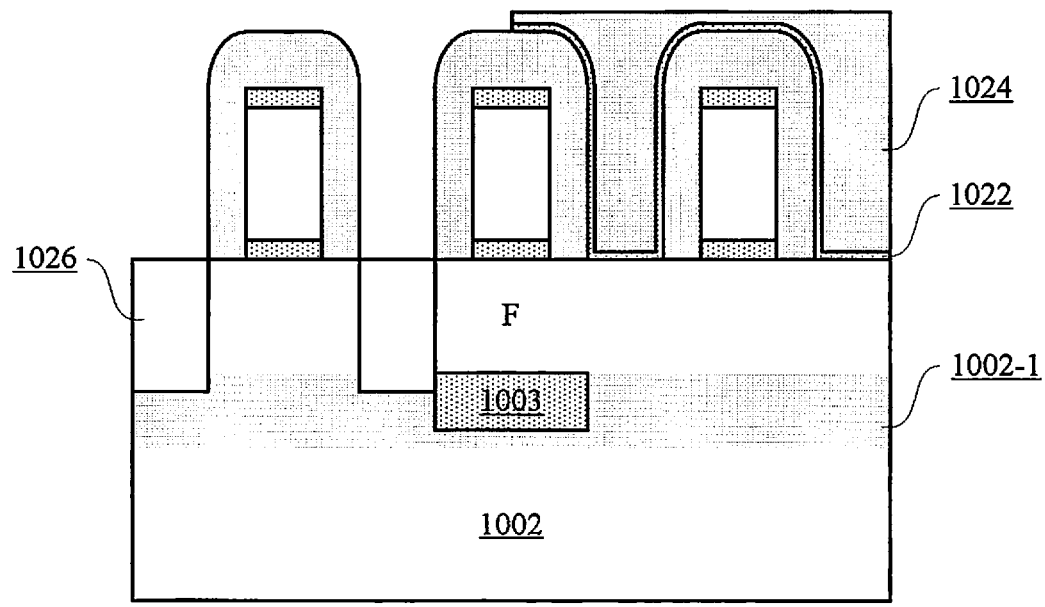

After that, as shown in FIG. 11, for the P-type device, a further semiconductor layer 1026 which is at least partially embedded into the fin F may be formed on opposite sides of the gate structure. In this example, the fin F is integral with the substrate 1002, and the semiconductor layer 1026 may even enter into the substrate 1002. The semiconductor layer 1026 may comprise a material different from that of the substrate 1002, for example, SiGe (with anatomic percentage of Geof, for example, about 35-75%, and preferably, changed gradually), to apply compressive stress to a channel region. Such an embedded semiconductor layer may be formed, for example, as follows. Specifically, the fin F may be selectively etched by, for example, RIE, with the sacrificial gate structure (in this example, with the nitride layer disposed on a top surface thereof) and the gate spacer (in this example, nitride) as a mask (and the etching may enter into the substrate 1002), to form a trench. Subsequently, the trench may be filled (by, for example, epitaxial growth followed by etching-back) with a semiconductor material, such as, SiGe. The mask layer on the top surface of the sacrificial gate conductor layer can prevent the sacrificial gate conductor layer from being damaged when the fin F is being selectively etched (in this example, both the sacrificial gate conductor layer and the substrate layer comprise silicon).

In the figures, the semiconductor layer 1026 is shown to have a top surface flush with that of the fin F. However, the present disclosure is not limited thereto. For example, depending on the amount of the etching-back, the top surface of the semiconductor layer 1026 may be higher or lower.

The semiconductor material may be in-situ doped when it is being grown. For example, P-type doping may be performed for the P-type device. The in-situ doped semiconductor layer 1026 may then form source/drain regions of the semiconductor device. After that, the mask layer 1022 and 1024 may be removed by selective etching, such as, RIE.

Figure 12:
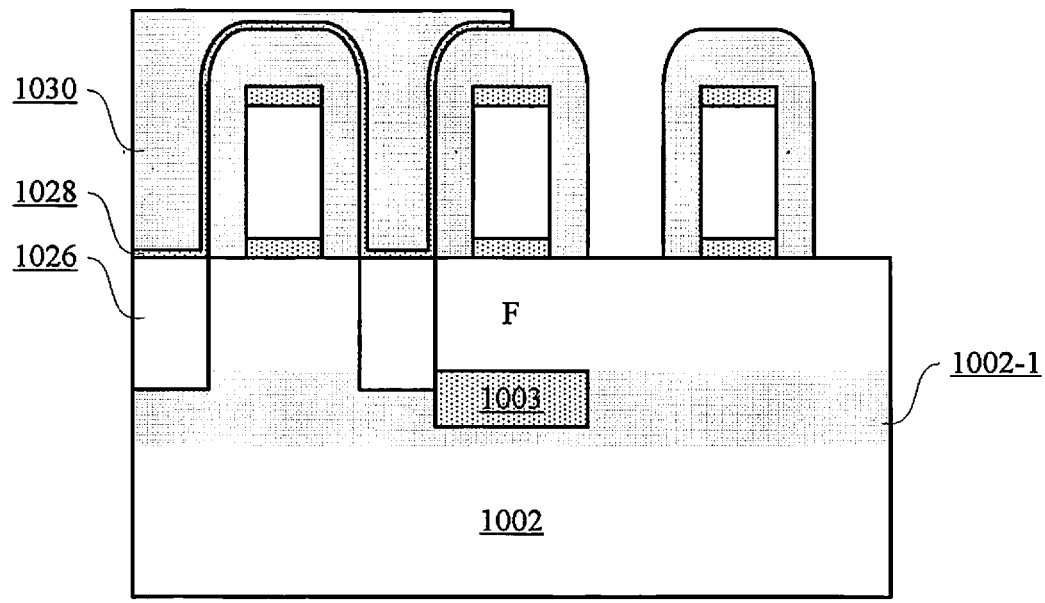

Likewise, similar processes may be performed on the N-type device on the other side. For example, as shown in FIG. 12, the region for the P-type device may be masked by a mask layer. For example, the mask layer may comprise an oxide layer 1028 with a thickness of about 3-10 nm and a nitride layer 1030. The mask layer may extend onto the top surface of the middle gate structure, and expose the region for the N-type device.

Figure 13:
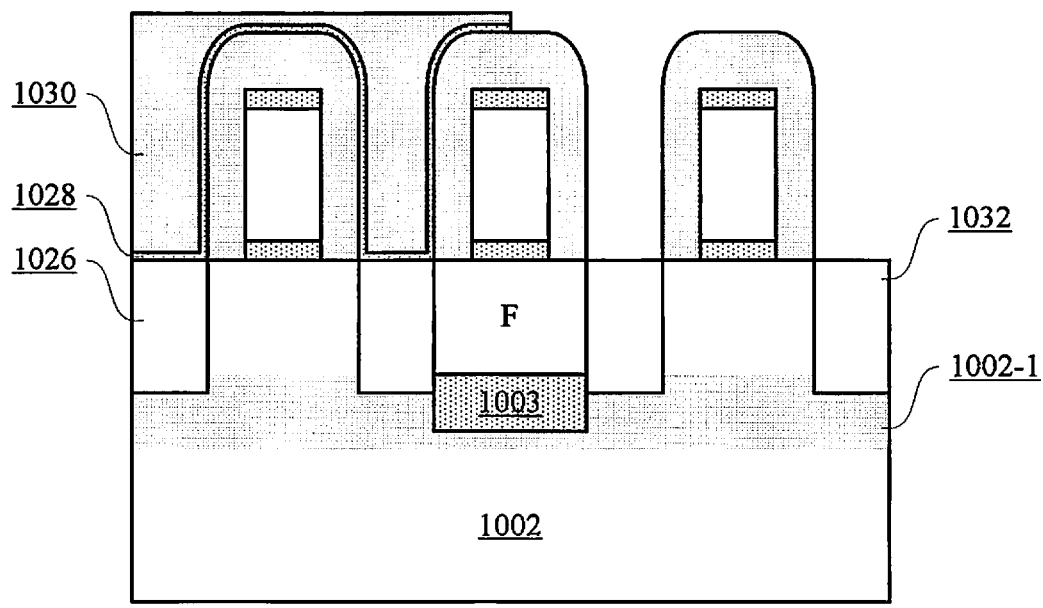

After that, as shown in FIG. 13, a further semiconductor layer 1032 which is at least partially embedded into the fin F may also be formed on opposite sides of the gate structure of the N-type device. In this example, the fin F is integral with the substrate 1002, and the semiconductor layer 1032 may even enter into the substrate 1002. The semiconductor 1032 may comprise a material different from that of the substrate 1002, for example, Si:C (with an atomic percentage of C of, for example, about 0.32%), to apply tensile stress to a channel region. Such an embedded semiconductor layer may be formed, for example, as described above. The semiconductor material may be in-situ doped when it is being grown. For example, N-type doping may be performed for the N-type device. The in-situ doped semiconductor layer 1032 may then form source/drain regions of the semiconductor device. After that, the mask layer 1030 and 1028 may be removed by selective etching, such as, RIE.

Although an example in which embedded source/drain regions are epitaxially grown is described, the present disclosure is not limited thereto. For example, the source/drain regions may be formed by directly implanting ions into the fin F.

After that, a gate replacement process may be performed.

Figure 14:
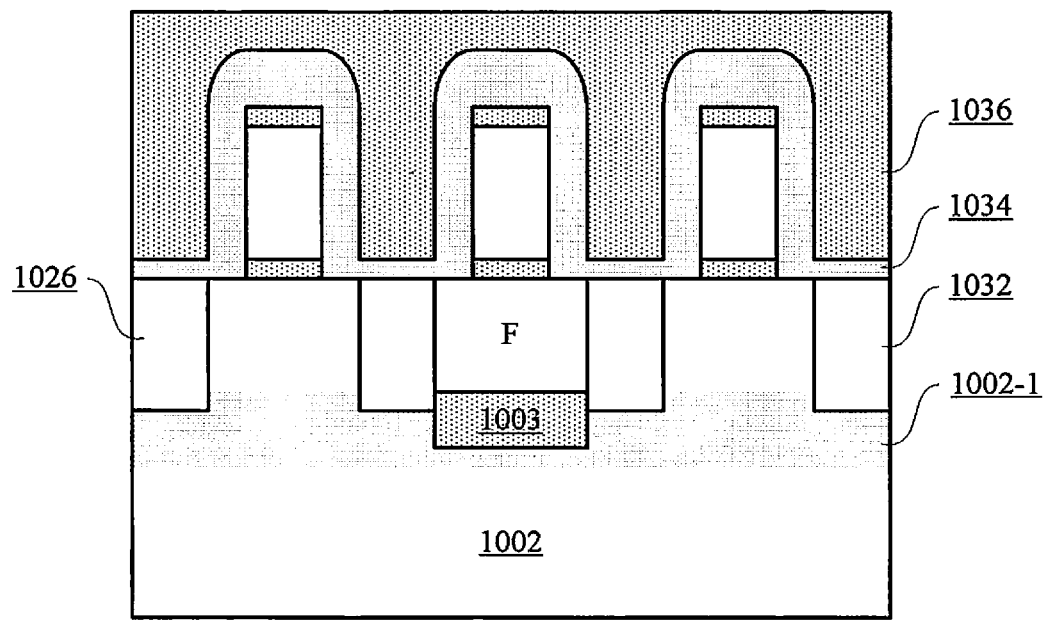

For example, as shown in FIG. 14, an interlayer dielectric layer 1036 may be formed on the substrate by, for example, deposition. The interlayer dielectric layer 1036 may comprise oxide with a thickness sufficient to fill up the space between respective gate structures. Further, an etching stop liner 1034 may be formed by, for example, deposition. The etching stop liner 1034 may comprise nitride with a thickness of about 5-20 nm. In this example, because the etching stop liner 1034, the gate spacers 1020, and the nitride layer 1016 in the mask all comprise nitride, they are shown as a whole. Furthermore, for convenience of drawing, the gate spacers 1020 and the nitride layer 1016 in the mask are not shown to be increased in thickness due to the deposited etching stop liner 1034.

Figure 15:
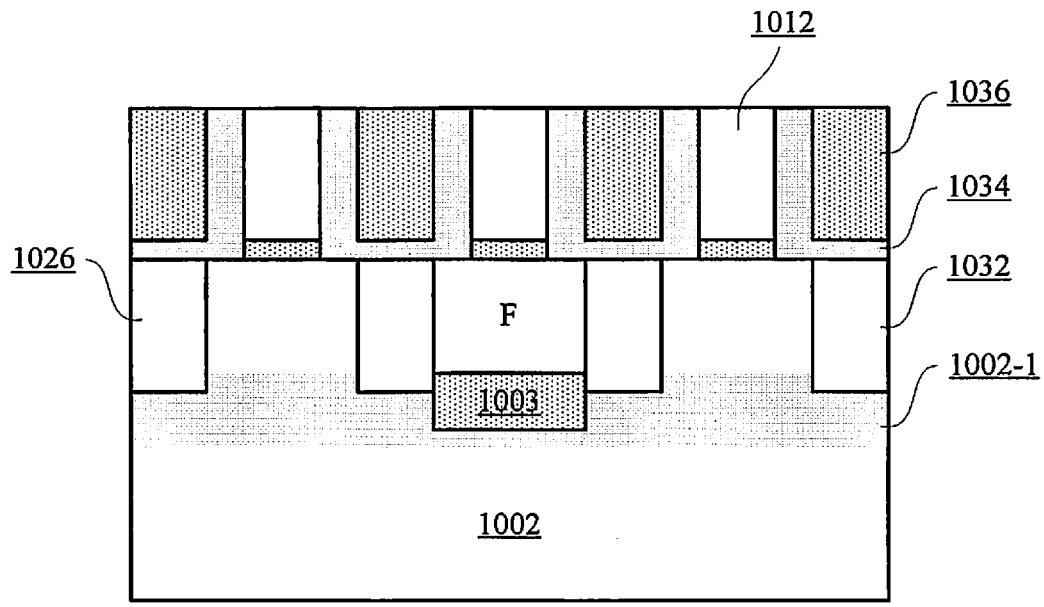
Figure 16:
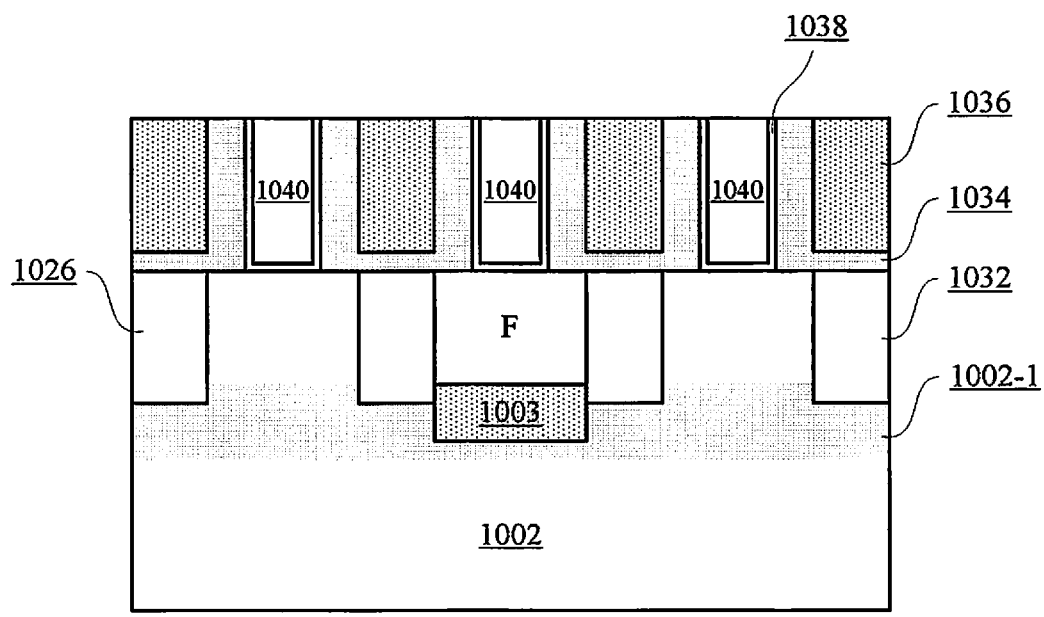

Subsequently, as shown in FIG. 15, a planarization process, such as, CMP, may be performed until the sacrificial gate structures are exposed. In particular, the sacrificial gate conductor layer 1012 is exposed. The sacrificial gate conductor layer 1012 may be removed by selective etching, for example, wet etching with a TMAH solution. The sacrificial gate dielectric layer 1010 may be further removed by selective etching, for example, wet etching with an HF solution or a BOE solution. In this way, trenches are formed inside the respective gate spacers 1020. After that, as shown in FIG. 16, replacement gate stacks may be formed in the respective trenches (by, for example, deposition followed by planarization). In particular, the replacement gate stacks each may comprise a replacement gate dielectric layer 1038 and a replacement gate conductor layer 1040. The replacement gate dielectric layer 1038 may comprise a high-K gate dielectric material, such as, HfO$_2$, with a thickness of about 2-4 nm, and the replacement gate conductor layer 1040 may comprise a metal gate conductor, such as, any one of TiN, TiAl, TaN, or TiC, or a combination thereof. For the N-type device and the P-type device, the replacement gate conductor layer 1040 may comprise materials with different work functions. Further, before the replacement gate stacks are formed, an interface layer (for example, oxide) with a thickness of about 0.3-1.5 nm may be formed.

Figure 17:
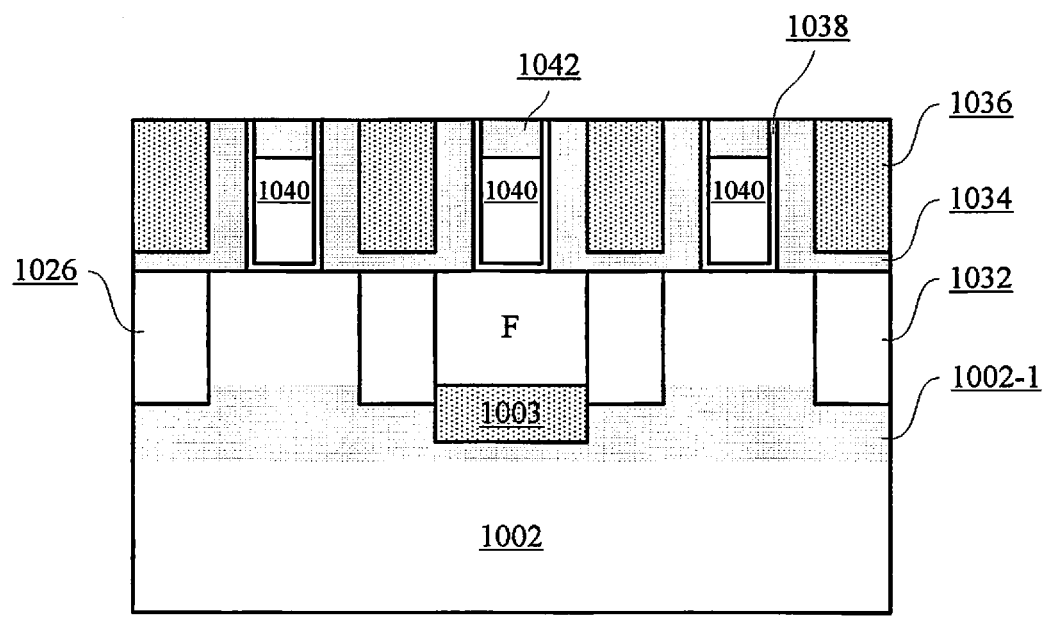

In an example of the present disclosure, the replacement gate conductor layer 1040 may be recessed, and then a dielectric material may be filled on top thereof. For example, as shown in FIG. 17, a part of the replacement gate conductor layer 1040 may be removed by selective etching, such as, RIE, and then spaces inside the respective gate spacers 1020, due to removal of the part from the top of the replacement gate conductor layer 1040, may be filled (by, for example, deposition followed by planarization) with a dielectric layer 1042, for example, nitride.

Figure 18:
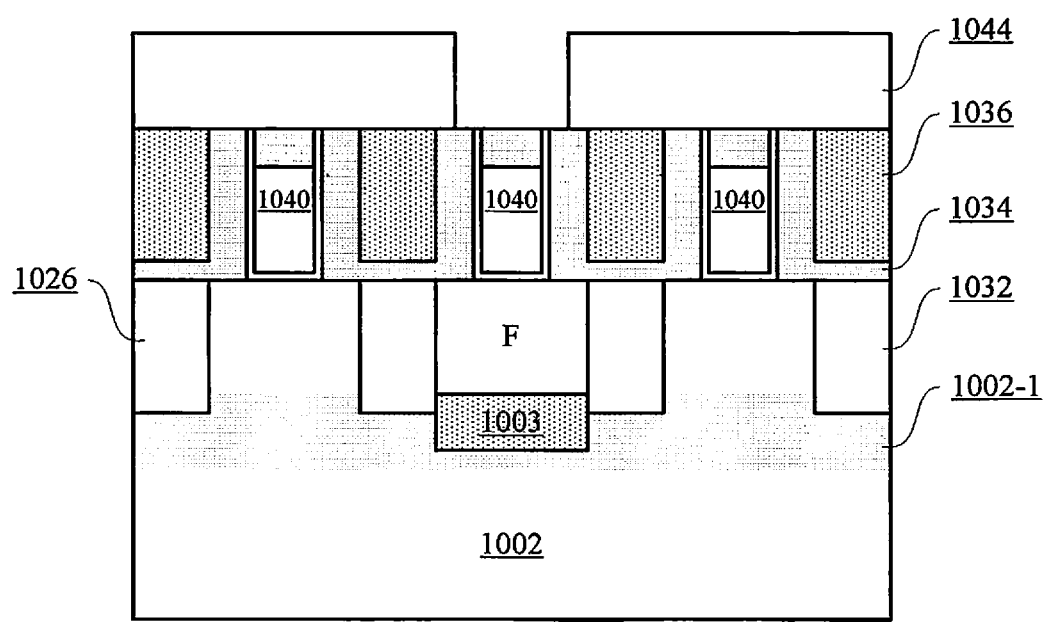
Figure 19:
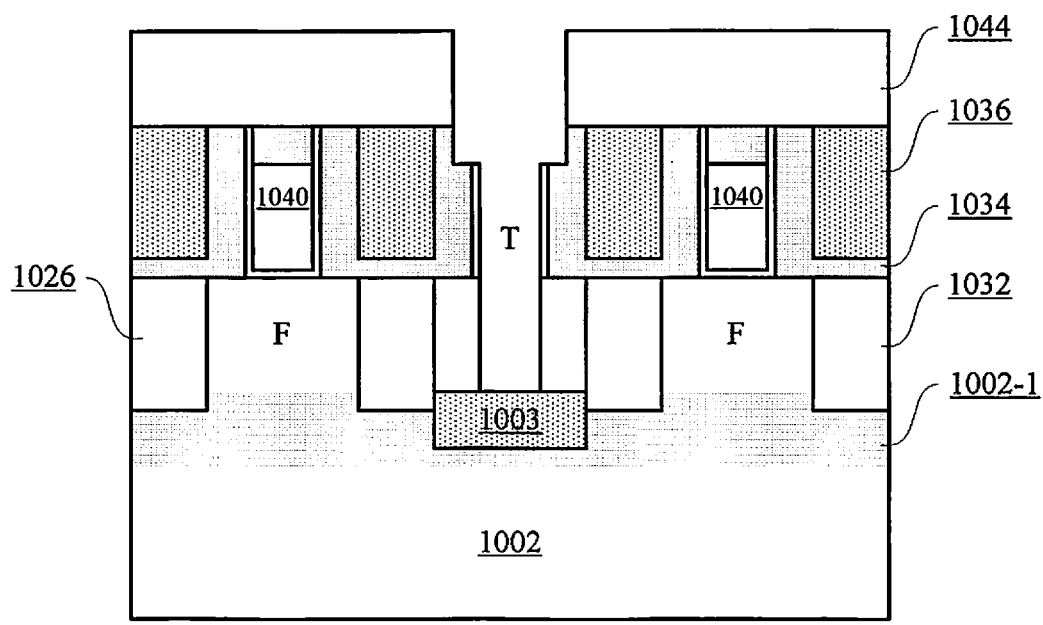

After that, as shown in FIG. 18, the region for the P-type device and the region for the N-type device may be masked by a mask layer 1044, for example, photoresist. For example, the mask layer 1044 may extend onto the top of the dummy gate spacer, and expose the region for the dummy gate stack. Subsequently, portions of the dielectric layer 1042, the replacement gate conductor layer 1040, the replacement gate dielectric layer 1038, and the fin F in this region may be removed in turn by selective etching, for example, RIE. In this example, the etching may be stopped at the insulation layer 1003, resulting in a trench T which passes through the fin F and reaches the insulation layer 1003, as shown in FIG. 19. In this example, portions of the replacement gate dielectric layer 1038 on the sidewalls of the trench T are not removed. However, these portions of replacement gate dielectric layer 1038 may be also removed. After that, the mask layer 1044 may be removed.

Because the selective etching is performed with respect to the gate spacer 1020 (although in this embodiment, a part from its top may be removed when performing RIE on the dielectric layer 1042 of nitride), the trench T may be self-aligned to a space defined by the gate spacer 1020. In particular, the sidewalls of the trench T extends substantially along inner walls of the gate spacer 1020 (in this example, recessed inwardly by the thickness of the replacement gate dielectric layer 1038, and such a recess is negligible).

Figure 20:
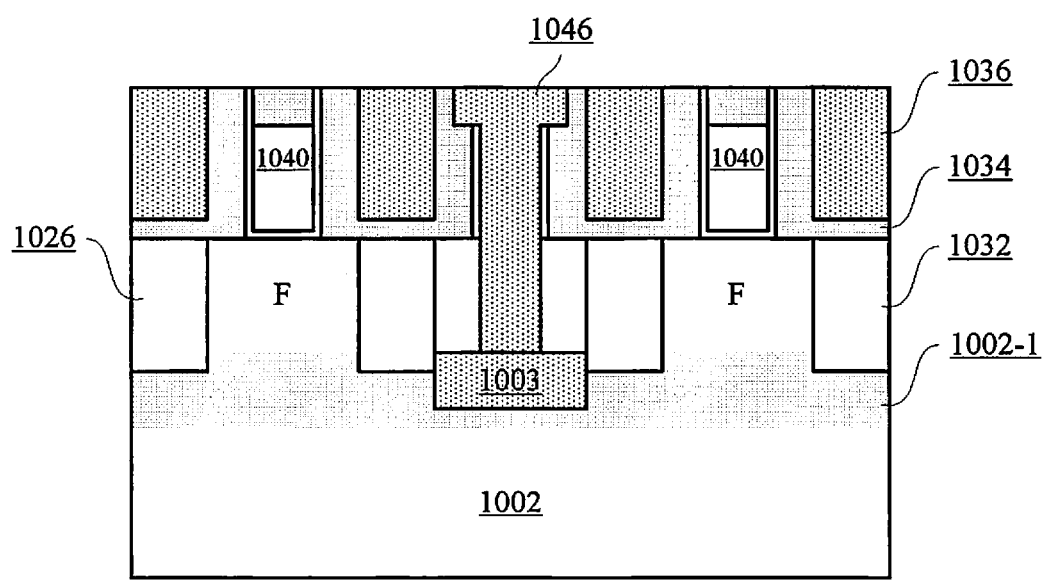

Next, as shown in FIG. 20, the trench T may be filled (by, for example, deposition followed by planarization) with a dielectric material, such as, oxides, to form an isolation section 1046. Because the trench T is self-aligned to the space defined by the gate spacer 1020, the isolation section 1046 formed in the trench T is also self-aligned to the space defined by the gate spacer 1020.

Figure 21:
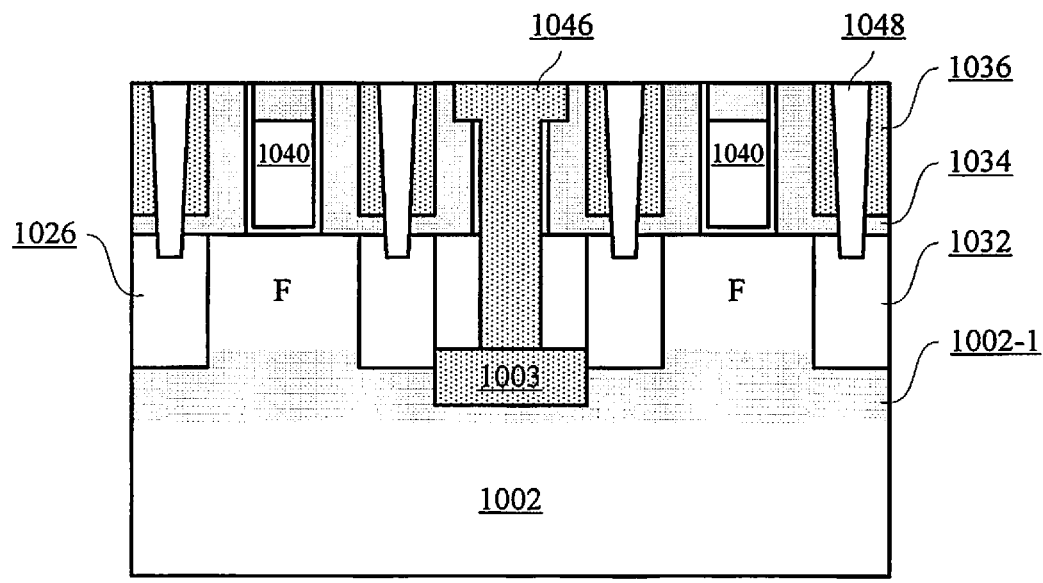

After the devices and the self-aligned isolation section are formed as described above, other peripheral components may be further formed. For example, as shown in FIG. 21, a source/drain contact 1048 may be formed. The source/drain contact 1048 may be formed by etching a contact hole and then filling the hole with a conducting material, such as, metal (for example, Cu or W).

As shown in FIG. 21, the semiconductor arrangement according to this embodiment of the present disclosure may comprise the P-type device and the N-type device. Each of the devices may comprise a respective gate stack (comprising the replacement gate dielectric layer 1038 and the replacement gate conductor layer 1040) and the gate spacer 1020 disposed on the sidewalls of the gate stack. Between the two devices, the dummy gate spacer may be formed. As described above, the isolation section 1046 is self-aligned to the space defined by the dummy gate spacer. Further, the insulation layer 1003 is formed under the isolation section 1046 and abuts the isolation section 1046.

FIGS. 22-31 are schematic views illustrating some steps of a process for manufacturing a semiconductor arrangement in accordance with another embodiment of the present disclosure.

Figure 22A:
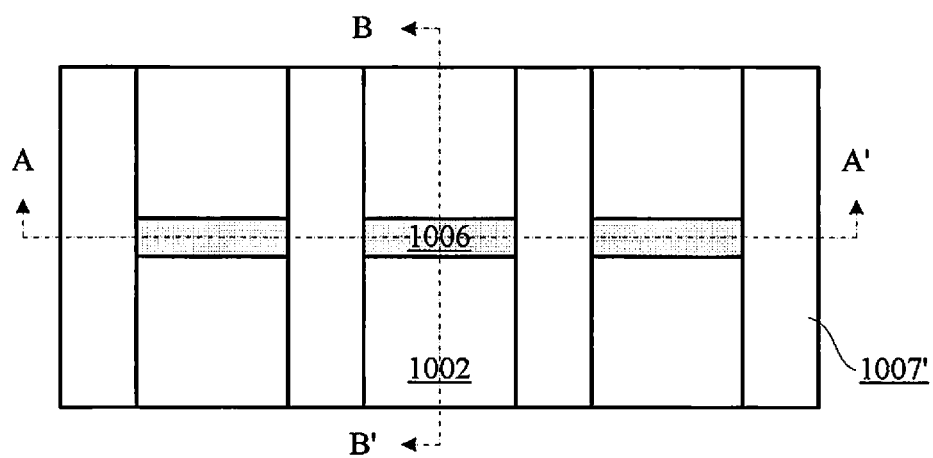
FIGS. 22-31 are schematic views illustrating some steps of a process for manufacturing a semiconductor arrangement in accordance with another embodiment of the present disclosure.
Figure 22B:
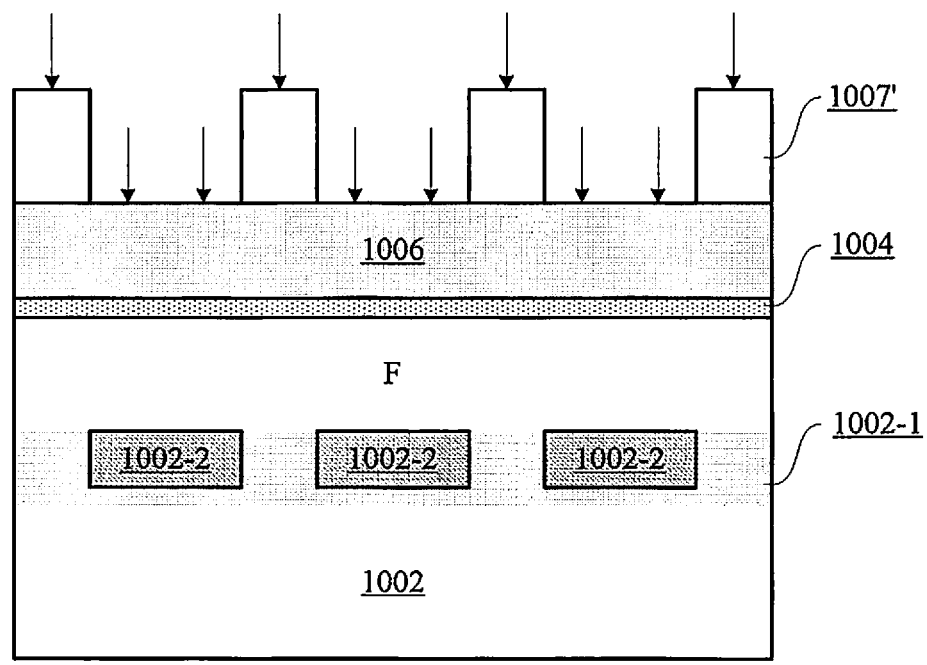
Figure 22C:
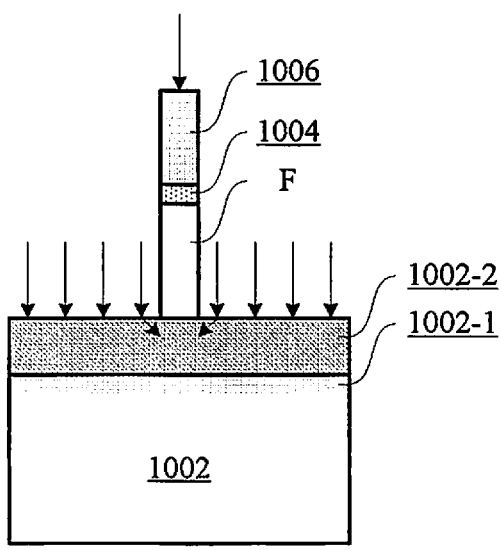
Figure 23A:
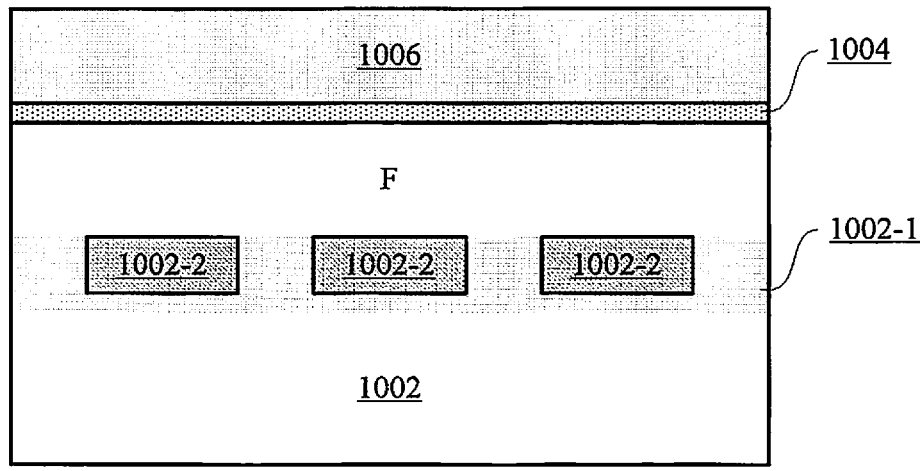
Figure 23B:
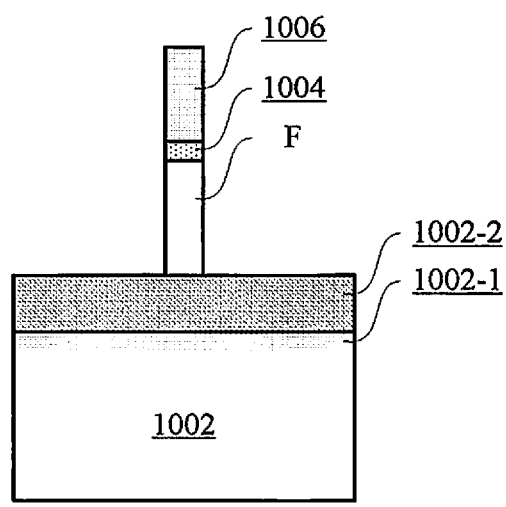

After the fin F is formed as described with reference to FIGS. 1 and 2, as shown in FIG. 22 (FIG. 22(*a*) is a top view, FIG. 22(*b*) is a cross sectional view taken along line AA' in FIG. 22(a), and FIG. 22(c) is a cross sectional view taken along line BB' in FIG. 22(a)), a mask layer 1007' (for example, photoresist) may be formed. In addition to a region in which an isolation section is to be subsequently formed as described above, this mask layer 1007' further exposes a part of regions for respective devices (in which gate structures of the respective devices are to be formed subsequently). After that, as shown by arrows in the figure, implantation may be performed to modify a portion of the substrate 1002 to form a modified portion 1002-2. For such a modification process, reference may be made to the above descriptions given in conjunction with FIG. 3. After that, the mask layer 1007' may be removed, resulting in a structure shown by FIG. 23 (FIG. 23(a) corresponds to the cross sectional view of FIG. 22(b), and FIG. 23(b) corresponds to the cross sectional view of FIG. 22(c)).

Figure 24A:
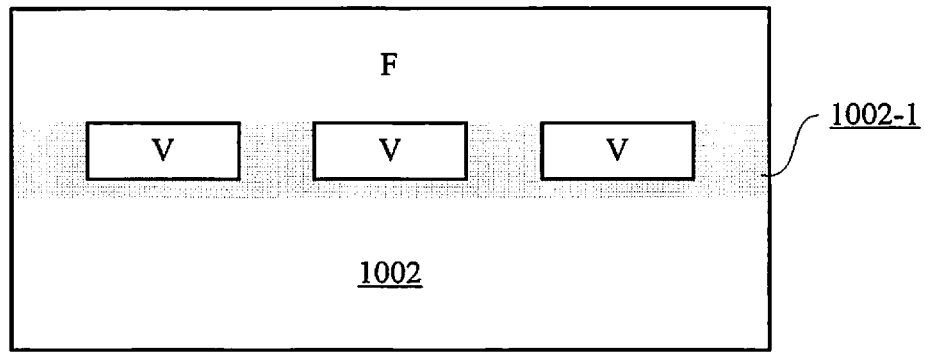
Figure 24B:
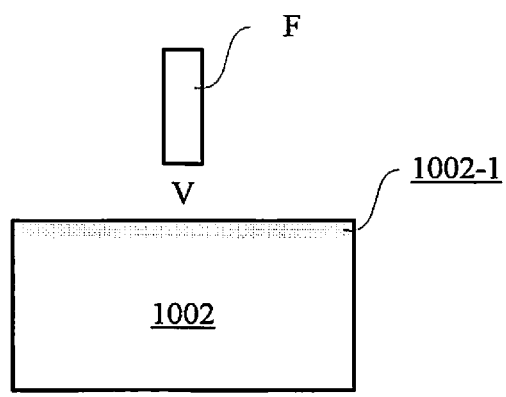
Figure 25A:
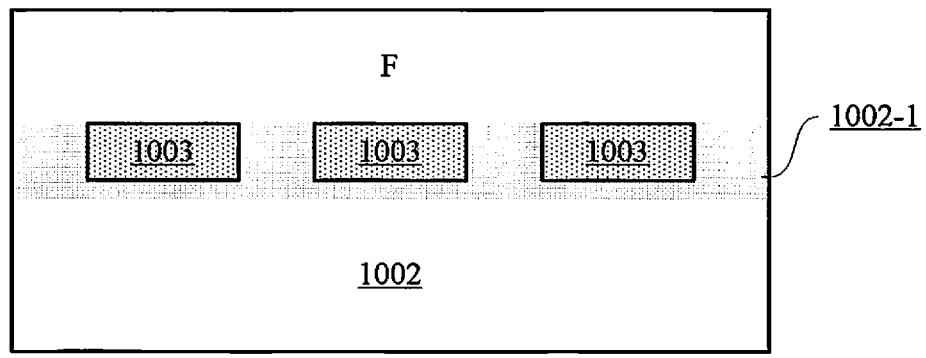
Figure 25B:
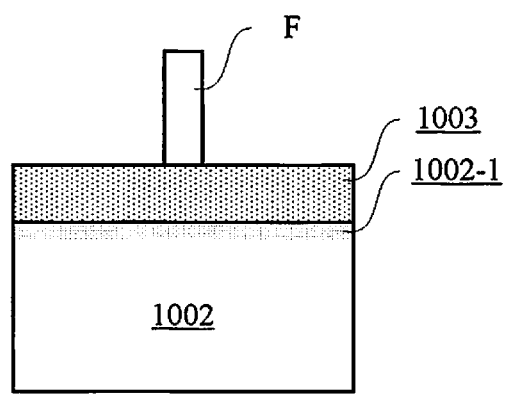

Next, as shown in FIG. 24, the mask layer 1006 and 1004 may be removed by, for example, RIE. After that, the amorphous silicon may be selectively etched by, for example, RIE, with respect to the crystalline silicon, to remove the modified portion 1002-2. In this way, gaps V are formed under the fin F. Subsequently, as shown in FIG. 25, the gaps V may be filled (by, for example, deposition followed by etching-back) with a dielectric material, such as, oxide, to form an insulation layer 1003. The insulation layer presents, in a top view, a shape defined by the mask layer 1007' (referring to FIG. 22(a)) (in this example, three vertically extending strips), and the insulation layer passes under the fin F.

In this example, the insulation layer 1003 is formed also in the left and right regions for the devices. However, the present disclosure is not limited thereto. For example, the insulation layer may be formed only in one region for the devices (for example, by changing the shape of the mask layer 1007').

The subsequent processes may be performed in a way similar to those in the above embodiments.

Figure 26A:
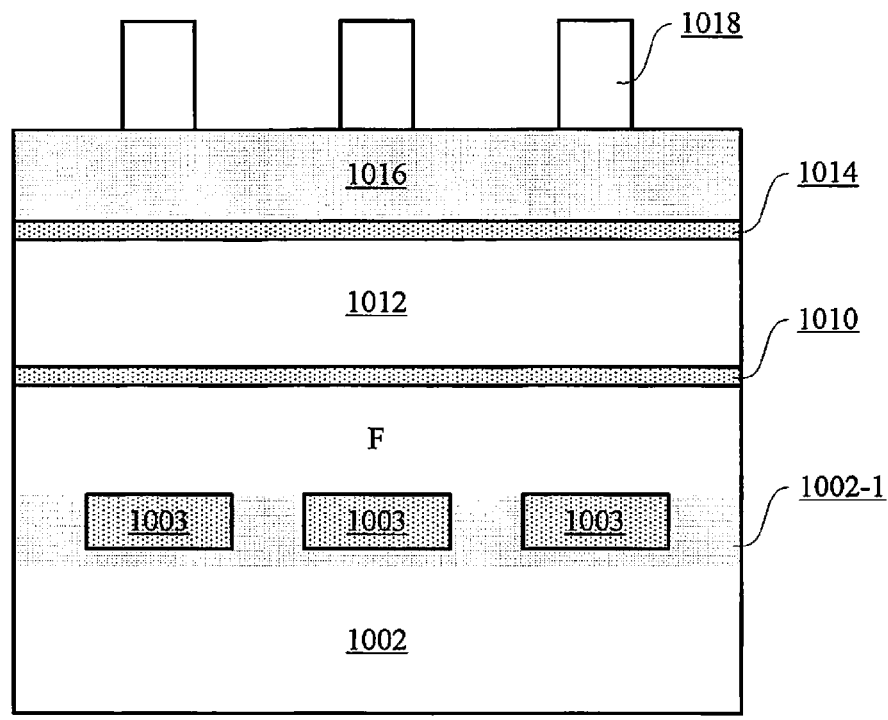
Figure 26B:
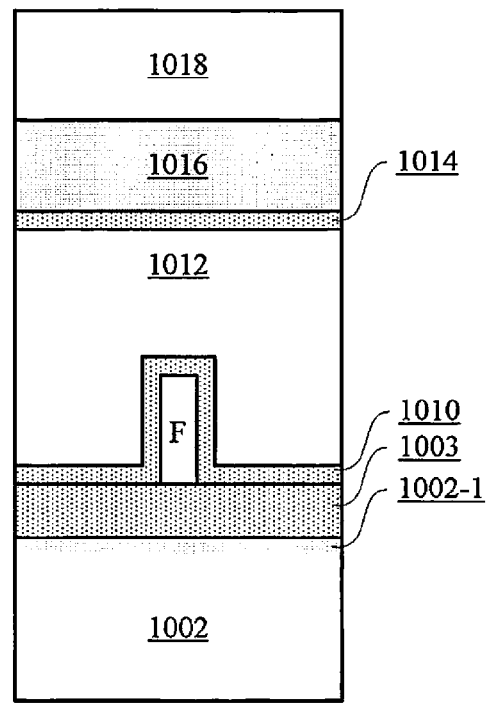
Figure 27A:
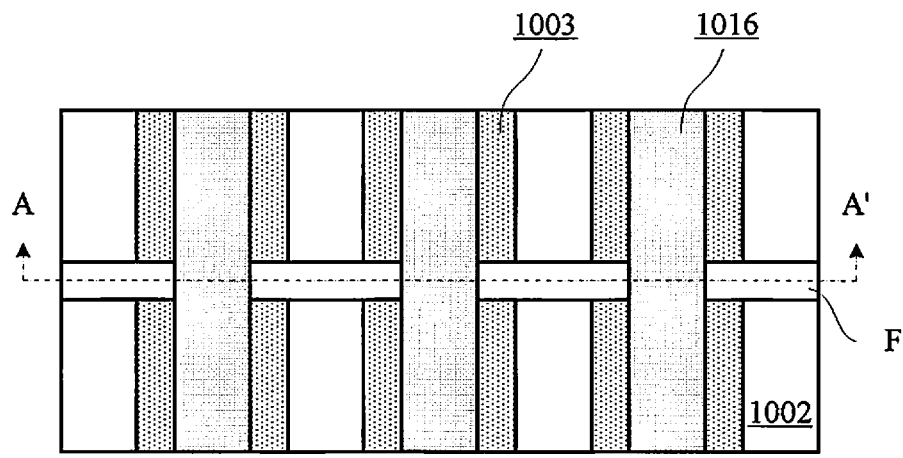

For example, as shown in FIG. 26, a sacrificial gate dielectric layer 1010 and a sacrificial gate conductor layer 1012 may be formed on the substrate in turn by, for example, deposition. After that, a mask layer may be formed on the sacrificial gate conductor 1012 by, for example, deposition. On the mask layer, photoresist 1018 may be formed. The photoresist 1018 may be patterned by, for example, photolithography, into a shape corresponding to the gate stacks to be formed. As shown in FIG. 27, patterning may then be performed to form three strip-like gate structures. For details thereof, reference may be made to the above descriptions given with reference to FIGS. 7 and 8.

Figure 27B:
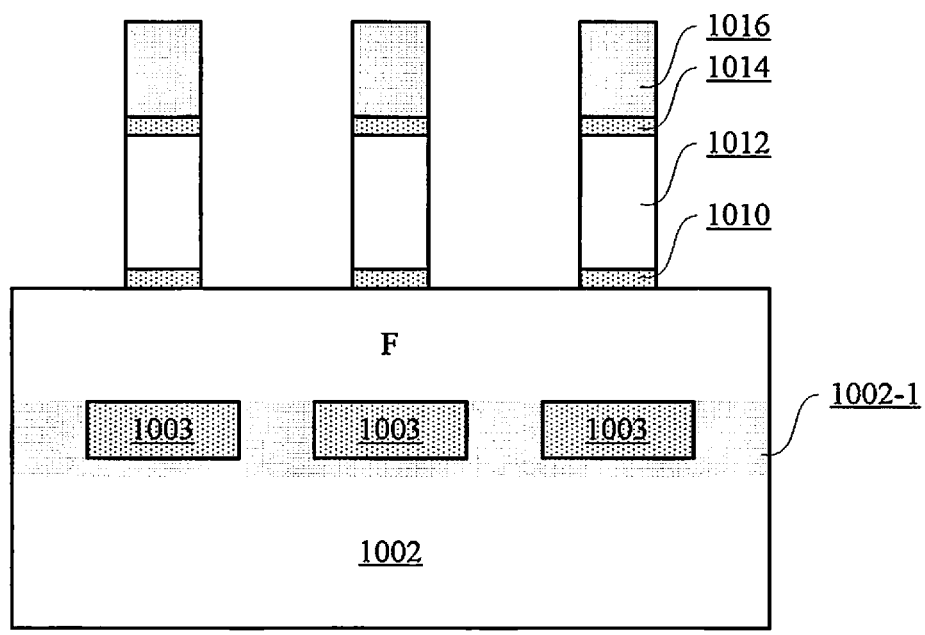
Figure 28:
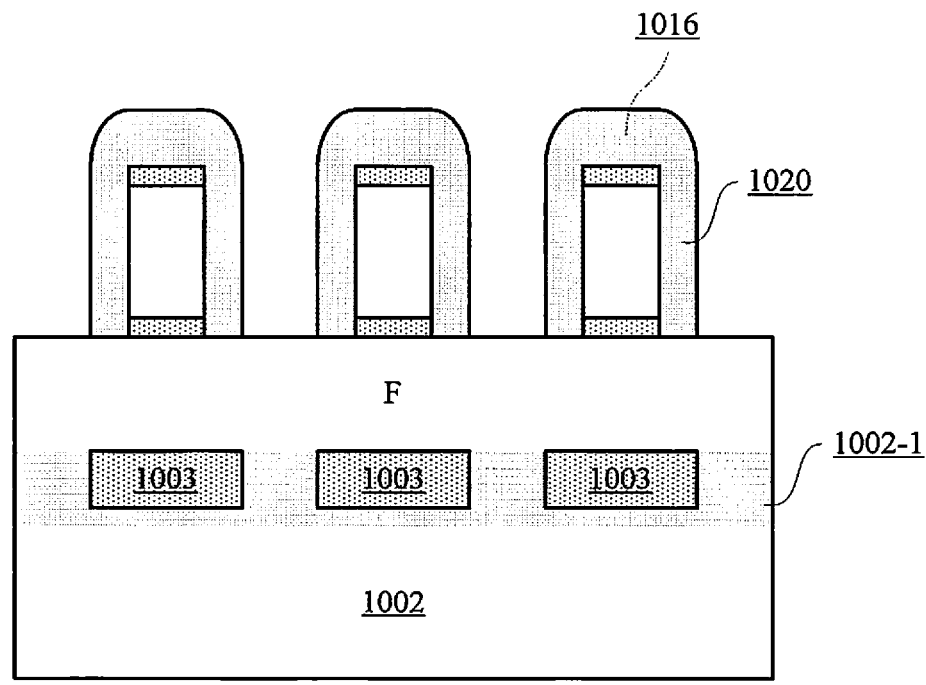
Figure 29:
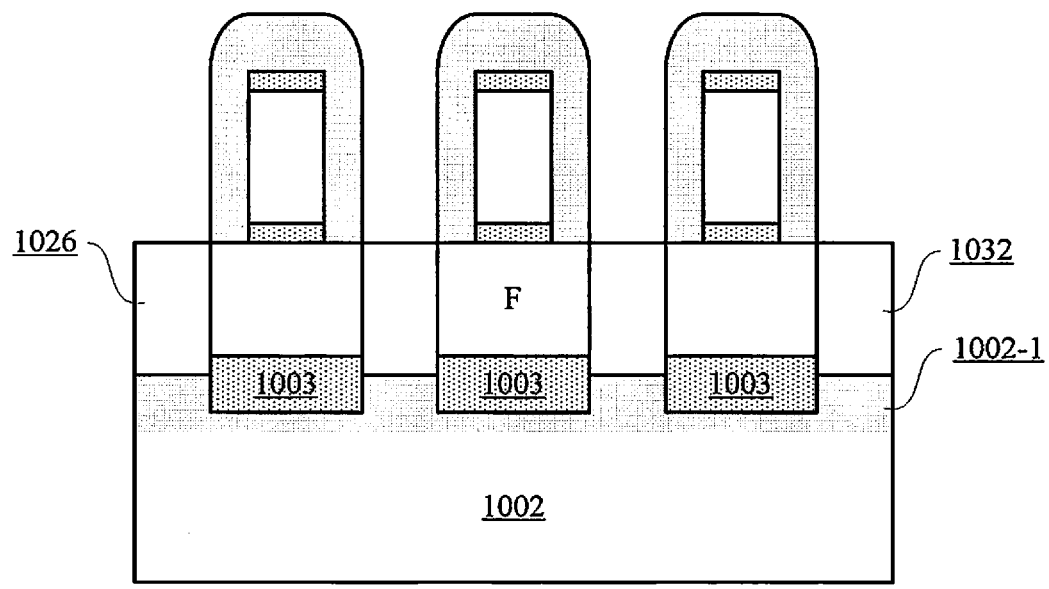

Next, as shown in FIG. 28 (corresponding to the cross section shown in FIG. 27(b)), gate spacers 1020 may be formed on sidewalls of the respective gate structures. With regard to this, reference may be made to the descriptions given in conjunction with FIG. 9. Further, as shown in FIG. 29, further semiconductor layers 1026 and 1032 which are at least partially embedded into the fin F may be formed on opposite sides of the respective gate structures. For details of the semiconductor layers 1026 and 1032, reference may be made to the above illustration given with reference to FIGS. 10-13.

In FIG. 29, side surfaces of the semiconductor layer 1026 or 1032 are shown to overlap with respective side surfaces of the insulation layer 1003. However, the present disclosure is not limited thereto. The side surfaces of the insulation layer 1003 (which are substantially defined by the mask layer 1007') may extend in the lateral direction not to reach or beyond the respective side surfaces (which are substantially defined by the spacer 1020) of the semiconductor layer 1026 or 1032.

Figure 30:
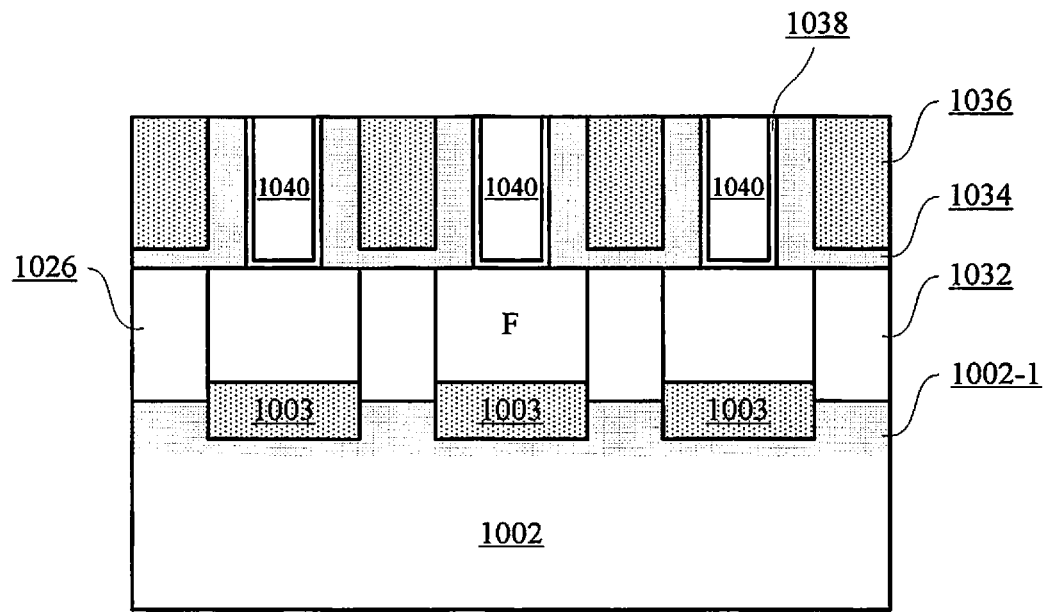

After that, the gate replacement process may be performed to form a replacement gate dielectric layer 1038 and a replacement gate conductor layer 1040 inside the respective gate spacers, as shown in FIG. 30. For this, reference may be made to the descriptions given in conjunction with FIGS. 14-15.

Figure 31:
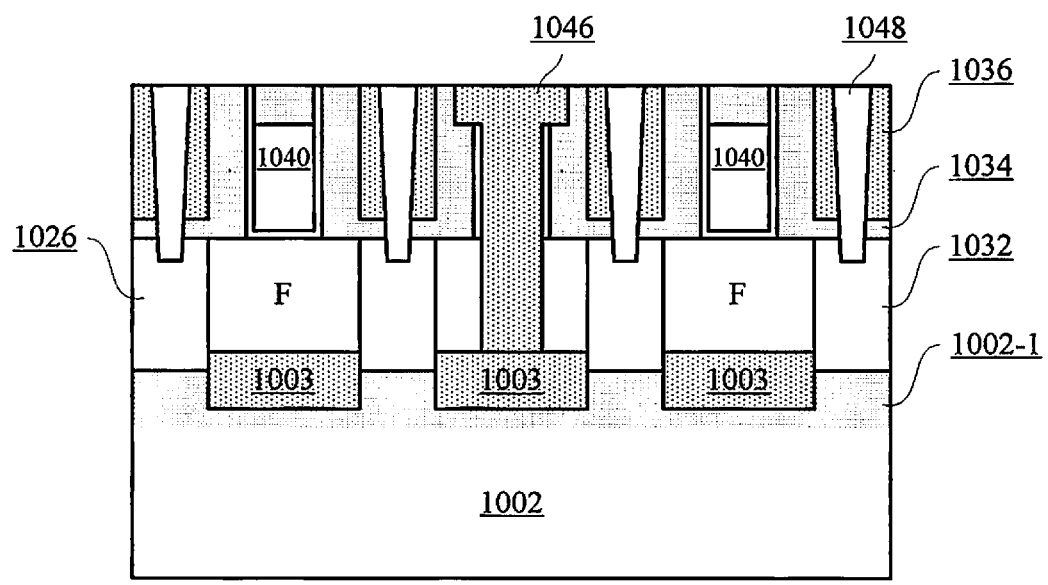

Subsequently, a self-aligned isolation section 1046 may be formed with aid of the middle gate structure (i.e., the dummy gate structure), as shown in FIG. 31. Further, peripheral components, such as, contacts 1048, may be formed. For details thereof, reference may be made to the descriptions given in conjunction with FIGS. 18-21.

As shown in FIG. 31, similar to the above embodiment, this semiconductor arrangement may comprise a P-type device and an N-type device. Each of the devices may comprise a respective gate stack (comprising the replacement gate dielectric layer 1038 and the replacement gate conductor layer 1040) and the gate spacer 1020 disposed on the sidewalls of the gate stack. Between the two devices, a dummy gate spacer may be formed. As described above, the isolation section 1046 is self-aligned to a space defined by the dummy gate spacer. Further, the insulation layer 1003 is formed under the isolation section 1046 and abuts the isolation section 1046.

Further, this semiconductor arrangement may further comprise the insulation layer 1003 which is formed under the fin F of the P-type device and/or the N-type device. As described above, the insulation layer 1003 mainly extends under the gate structure(s), and thus functions like an electrical isolation incorporated under the channel region(s) of the device(s). Therefore, advantages like those of an SOI structure, such as, a reduced leakage current, may be achieved. On the other hand, the insulation layer 1003 may extend not to be under the whole source/drain regions, and therefore at least a part of the source/drain regions is contiguous with the bulk substrate. In this way, some disadvantages of an SOI structure, such as, the self-heating effect, may be avoided.

Although the gate-last process is illustrated in the above embodiments, the present disclosure is not limited thereto. The technology in the present disclosure is also applicable to the gate-first process.

In the above descriptions, details of patterning and etching of the layers are not described. It is to be understood by those skilled in the art that various measures may be utilized to form the layers and regions in desired shapes. Further, to achieve the same feature, those skilled in the art can devise processes not entirely the same as those described above. The mere fact that the various embodiments are described separately does not mean that means recited in the respective embodiments cannot be used in combination to advantage.

From the foregoing, it will be appreciated that specific embodiments of the disclosure have been described herein for purposes of illustration, but that various modifications may be made without deviating from the disclosure. In addition, many of the elements of one embodiment may be combined with other embodiments in addition to or in lieu of the elements of the other embodiments. Accordingly, the technology is not limited except as by the appended claims.

I claim:

1. A semiconductor arrangement, comprising:
   a bulk semiconductor substrate;
   a fin formed on the substrate;

a first FinFET and a second FinFET formed on the substrate, wherein the first FinFET comprises a first gate stack intersecting the fin and a first gate spacer disposed on sidewalls of the first gate stack, the second FinFET comprises a second gate stack intersecting the fin and a second gate spacer disposed on sidewalls of the second gate stack;

a dummy gate spacer formed between the first FinFET and the second FinFET and intersecting the fin;

an isolation section self-aligned to a space defined by the dummy gate spacer, wherein the isolation section electrically isolates the first FinFET from the second FinFET; and an insulation layer disposed under a bottom surface of the isolation section and abutting the isolation section, wherein the insulation layer has a width defined between its opposite sidewalls greater than a width of the space defined by the dummy gate spacer, so that portions of the fin directly under the dummy gate spacer have respective bottom surfaces landed at least partially onto the insulation layer.

2. The semiconductor arrangement of claim 1, wherein the substrate comprises a doped well, and the insulation layer is disposed in an upper portion of the doped well and defined between the first FinFET and the second FinFET.

3. The semiconductor arrangement of claim 2, wherein the insulation layer extends substantially along the space defined by the dummy gate spacer.

4. The semiconductor arrangement of claim 3, wherein a sidewall of the insulation layer facing the first FinFET is closer to the first FinFET than a sidewall of the isolation section facing the first FinFET, and a sidewall of the insulation layer facing the second FinFET is closer to the second FinFET than a sidewall of the isolation section facing the second FinFET.

5. The semiconductor arrangement of claim 4, further comprising a first further localized insulation layer formed under the fin in a region for the first FinFET and/or a second further localized insulation layer formed under the fin in a region for the second FinFET, wherein the first further insulation layer extends substantially along the first gate stack, while limited in size along a longitudinal direction of fin so as not to extend beyond the region for the first FinFET, and/or wherein the second further insulation layer extends substantially along the second gate stack, while limited in size along the longitudinal direction of fin so as not to extend beyond the region for the second FinFET.

6. The semiconductor arrangement of claim 1, wherein the isolation section comprises a dielectric material layer whose sidewalls extend substantially along inner walls of the dummy gate spacer.

7. The semiconductor arrangement of claim 1, wherein the first gate stack and the second gate stack are recessed with respect to the first gate spacer and the second gate spacer, respectively, and the semiconductor arrangement further comprises dielectric layers disposed on top of the first gate stack and the second gate stack inside the first gate spacer and the second gate spacer, respectively.

8. The semiconductor arrangement of claim 1, further comprising a further semiconductor layer which is at least partially embedded into the fin on respective opposite sides of the first gate stack and/or the second gate stack, wherein the first FinFET and/or the second FinFET comprise respective source/drain regions at least partially formed in the further semiconductor layer.

* * * * *